US009661252B2

(12) United States Patent
Hagihara

(10) Patent No.: US 9,661,252 B2
(45) Date of Patent: May 23, 2017

(54) IMAGE CAPTURING DEVICE

(71) Applicant: OLYMPUS CORPORATION, Tokyo (JP)

(72) Inventor: Yoshio Hagihara, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/059,959

(22) Filed: Mar. 3, 2016

(65) Prior Publication Data
US 2016/0182845 A1 Jun. 23, 2016

Related U.S. Application Data

(63) Continuation of application No. PCT/JP2014/072700, filed on Aug. 29, 2014.

(30) Foreign Application Priority Data

Sep. 9, 2013 (JP) .................................. 2013-186523

(51) Int. Cl.
*H04N 5/378* (2011.01)
*H03M 1/18* (2006.01)
*H03M 1/12* (2006.01)

(52) U.S. Cl.
CPC .............. *H04N 5/378* (2013.01); *H03M 1/12* (2013.01); *H03M 1/186* (2013.01); *H03M 1/123* (2013.01)

(58) Field of Classification Search
CPC ........ H03M 1/12; H03M 1/123; H03M 1/186; H04N 5/378
See application file for complete search history.

(56) References Cited

U.S. PATENT DOCUMENTS 8,896,478 B2 * 11/2014 Tsai ...................... H03M 1/069
341/144
8,988,268 B2 * 3/2015 Sugimoto ............... H03M 1/38
341/118

(Continued)

FOREIGN PATENT DOCUMENTS

JP 2013-70255 A 4/2013
WO 2009/014057 A1 1/2009

OTHER PUBLICATIONS

International Search Report dated Oct. 28, 2014, issued in counterpart International Application No. PCT/JP2014/072700, with English translation (3 page).

(Continued)

*Primary Examiner* — Amy Hsu
(74) *Attorney, Agent, or Firm* — Westerman, Hattori, Daniels & Adrian, LLP

(57) ABSTRACT

An image capturing device includes: an image capturing section having a plurality of pixels disposed in a matrix and configured to output a pixel signal via a first signal line connected to pixels arranged in a first direction among the plurality of pixels; a plurality of calculators including: a comparator configured to compare a magnitude of a first analog signal with a threshold value to generate a digital value according to a comparison result; an amplification section configured to amplify the first analog signal by multiplying the first analog signal by an amplification degree $\beta$ ($1<\beta<2$) and output a second analog signal by executing computation according to the digital value; and a switching section configured to output one of the pixel signal and a $\beta$ estimation signal as the first analog signal when a most significant bit of a first digital value sequence is computed.

6 Claims, 8 Drawing Sheets

(56) References Cited

U.S. PATENT DOCUMENTS

| | | | |
|---|---|---|---|
| 2002/0047942 A1* | 4/2002 | Vorenkamp | H04N 5/455 348/731 |
| 2010/0207796 A1* | 8/2010 | Hironaka | G10L 19/00 341/144 |
| 2014/0035771 A1* | 2/2014 | Tsai | H03M 1/466 341/172 |
| 2014/0070976 A1* | 3/2014 | Hurrell | G11C 27/02 341/172 |

OTHER PUBLICATIONS

International Search Report dated Oct. 28, 2014, issued in counterpart International Application No. PCT/JP2014/072700 (1 page).

\* cited by examiner

IMAGE CAPTURING DEVICE

This application claims is a continuation application of International Patent Application No. PCT/JP2014/072700, filed on Aug. 29, 2014, whose priority is claimed on Japanese Patent Application No. 2013-186523, filed Sep. 9, 2013. The contents of both of the International Patent Application and the Japanese Patent Application are incorporated herein by reference in their entirety.

BACKGROUND OF THE INVENTION

Field of the Invention

The present invention relates to an image capturing device.

Description of the Related Art

As an analog-to-digital (AD) conversion scheme of converting an analog signal into a digital signal, (1) a successive approximation register AD conversion scheme, (2) a single-slope AD conversion scheme, (3) a cyclic AD conversion scheme, (4) a $\Delta\Sigma$AD conversion scheme, and so on are proposed.

In the publication of Japanese Unexamined Patent Application, First Publication No. 2013-70255 (hereinafter referred to as Patent Literature 1), a configuration of a cyclic AD conversion circuit capable of accurately estimating a value of an amplification degree $\beta$ ($1<\beta<2$) is shown as a cyclic AD conversion circuit using a cyclic AD conversion scheme. FIG. 8 shows an example of AD conversion using the cyclic AD conversion circuit of Patent Literature 1. The analog signal Vin of the AD conversion target is a signal of a range of 0<Vin<Vfs. The cyclic AD conversion circuit has a comparator and generates a digital value (0 or 1) according to a comparison result by comparing an analog signal Vin with a threshold value Vth.

Because the analog signal Vin is less than the threshold value Vth, a digital value of 0 is generated. The cyclic AD conversion circuit amplifies the analog signal Vin by multiplying the analog signal Vin by an amplification degree $\beta$ and further executes computation according to the digital value of 0 to output a residual signal Vres(1). The digital value of 0 generated by comparing the analog signal Vin with the threshold value Vth becomes a value of a most significant bit (MSB) of a digital value corresponding to the analog signal Vin.

Next, the cyclic AD conversion circuit performs a process similar to that described above on the residual signal Vres(1). Specifically, the cyclic AD conversion circuit compares the residual signal Vres(1) with the threshold value Vth. Because the residual signal Vres(1) is greater than the threshold value Vth, a digital value of 1 is generated. The cyclic AD conversion circuit amplifies the residual signal Vres(1) by multiplying the residual signal Vres(1) by the amplification degree $\beta$ and further executes computation according to the digital value of 1 to output a residual signal Vres(2). The digital value of 1 generated by comparing the residual signal Vres(1) with the threshold value Vth becomes a value of the next bit of the MSB of the digital value corresponding to the analog signal Vin.

Next, the cyclic AD conversion circuit performs a process similar to that described above on the residual signal Vres(2) and generates a digital value of 0 and a residual signal Vres(3). Thereafter, the cyclic AD conversion circuit iterates a similar process to generate a digital value of a necessary number of bits and a residual signal. In FIG. 8, a state in which the residual signal Vres(3), the digital value of 0 corresponding to the residual signal Vres(3), a residual signal Vres(4), and the digital value of 1 corresponding to the residual signal Vres(4) are generated is shown.

Through the above-described process, the cyclic AD conversion circuit acquires a digital value sequence (01001). This digital value sequence is a base $\beta$ digital value sequence having the amplification degree $\beta$ as a base. Lastly, the cyclic AD conversion circuit converts the base $\beta$ digital value sequence into a binary digital value sequence.

There is a problem in that degradation (for example, miscoding) of AD conversion precision occurs when a value of the amplification degree $\beta$ deviates from a design value due to variation in manufacturing conditions, and so on. Thus, the cyclic AD conversion circuit of Patent Literature 1 accurately estimates the value of the amplification degree $\beta$ and converts the base $\beta$ digital value sequence into a binary digital value sequence using the estimated value of the amplification degree $\beta$.

SUMMARY OF THE INVENTION

According to a first aspect of the present invention, an image capturing device includes: an image capturing section having a plurality of pixels disposed in a matrix and configured to output a pixel signal via a first signal line connected to pixels arranged in a first direction among the plurality of pixels; a plurality of calculators, each of which is configured to perform cyclic AD conversion and includes: a comparator configured to compare a magnitude of a first analog signal with a threshold value to generate a digital value according to a comparison result; an amplification section configured to amplify the first analog signal by multiplying the first analog signal by an amplification degree $\beta$ ($1<\beta<2$) and output a second analog signal by executing computation according to the digital value; and a switching section configured to output one of the pixel signal and a $\beta$ estimation signal for estimating a value of the amplification degree $\beta$ as the first analog signal when an MSB of a first digital value sequence including a plurality of digital values is computed, and to output the second analog signal as the first analog signal when a bit other than the MSB of the first digital value sequence is computed, the plurality of first calculators outputting the first digital value sequence; a latch section configured to latch the first digital value sequence; a $\beta$ estimation signal output section configured to output the $\beta$ estimation signal; a $\beta$ estimation section configured to estimate a value of the amplification degree $\beta$ based on the first digital value sequence when the $\beta$ estimation signal is output as the first analog signal; and a binarization section configured to acquire a second digital value sequence which is a binary number, based on the first digital value sequence and the estimated value of the amplification degree $\beta$. The plurality of calculators are disposed one by one in correspondence with one or more columns of an array of the plurality of pixels. The $\beta$ estimation signal output section is disposed in correspondence with two or more of the plurality of calculators. The $\beta$ estimation section is disposed in correspondence with two or more of the plurality of calculators. The binarization section is disposed in correspondence with two or more of the plurality of calculators.

According to a second aspect of the present invention, an image capturing device includes: an image capturing section having a plurality of pixels disposed in a matrix and configured to output a pixel signal via a first signal line connected to pixels arranged in a first direction among the plurality of pixels; a plurality of first calculators, each of which is configured to perform cyclic AD conversion and includes: a first comparator configured to compare a magnitude of a first analog signal with a first threshold value to generate a first digital value according to a comparison result; a first amplification section configured to amplify the first analog signal by multiplying the first analog signal by a first amplification degree $\beta1$ ($1<\beta1<2$) and output a second analog signal by executing computation according to the first digital value; and a first switching section configured to output one of the pixel signal and a first $\beta$ estimation signal for estimating a value of the first amplification degree $\beta1$ as the first analog signal when an MSB of a first digital value sequence including a plurality of first digital values is computed, and output the second analog signal as the first analog signal when a bit other than the MSB of the first digital value sequence is computed, the plurality of first calculators outputting the first digital value sequence and the second analog signal; a plurality of second calculators, each of which is configured to perform cyclic AD conversion and includes: a second comparator configured to compare a magnitude of a third analog signal with a second threshold value to generate a second digital value according to a comparison result; a second amplification section configured to amplify the third analog signal by multiplying the third analog signal by a second amplification degree $\beta2$ ($1<\beta<2$) and output a fourth analog signal by executing computation according to the second digital value; and a second switching section configured to output one of the second analog signal and a second $\beta$ estimation signal for estimating a value of the second amplification degree $\beta2$ as the third analog signal when an MSB of a second digital value sequence including a plurality of second digital values is computed, and output the fourth analog signal as the third analog signal when a bit other than the MSB of the second digital value sequence is computed, the plurality of second calculators outputting the second digital value sequence; a latch section configured to latch the first digital value sequence and the second digital value sequence; a $\beta$ estimation signal output section configured to output the first $\beta$ estimation signal and the second $\beta$ estimation signal; a $\beta$ estimation section configured to estimate a value of the first amplification degree $\beta1$ based on the first digital value sequence when the first $\beta$ estimation signal is output as the first analog signal and estimate a value of the second amplification degree $\beta2$ based on the second digital value sequence when the second $\beta$ estimation signal is output as the third analog signal; and a binarization section configured to acquire a third digital value sequence which is a binary number, based on the first digital value sequence, the estimated value of the first amplification degree $\beta1$, the second digital value sequence, and the estimated value of the second amplification degree $\beta2$. The plurality of first calculators are disposed one by one in correspondence with one or more columns of an array of the plurality of pixels. The plurality of second calculators are disposed one by one in correspondence with one or more columns of an array of the plurality of pixels. The $\beta$ estimation signal output section is disposed in correspondence with two or more of the plurality of second calculators. The $\beta$ estimation section is disposed in correspondence with two or more of the plurality of second calculators. The binarization section is disposed in correspondence with two or more of the plurality of second calculators.

According to a third aspect of the present invention, in the image capturing device of the first aspect, when the second digital value sequence corresponding to the pixel signal is acquired, the $\beta$ estimation section may estimate the value of the amplification degree $\beta$ corresponding to a predetermined calculator among the plurality of calculators based on two series of first digital value sequences corresponding to the same $\beta$ estimation signal to compute an approximate $\beta$ value based on the estimated value of the amplification degree $\beta$, and the binarization section may acquire the second digital value sequence corresponding to each of the two or more of the plurality of calculators based on the first digital value sequence output from each of the two or more of the plurality of calculators and the approximate $\beta$ value.

According to a fourth aspect of the present invention, in the image capturing device of the third aspect, the plurality of calculators may be divided into a plurality of groups so that each group includes a predetermined number of calculators, and the $\beta$ estimation section may compute the approximate $\beta$ value corresponding to the group based on the estimated value of the amplification degree $\beta$.

According to a fifth aspect of the present invention, in the image capturing device of the second aspect, when the third digital value sequence corresponding to the pixel signal is acquired, the $\beta$ estimation section may estimate the value of the first amplification degree $\beta1$ corresponding to a predetermined first calculator among the plurality of first calculators based on two series of first digital value sequences corresponding to the same first $\beta$ estimation signal to compute a first approximate $\beta$ value based on the estimated value of the first amplification degree $\beta1$ and estimate the value of the second amplification degree $\beta2$ corresponding to a predetermined second calculator among the plurality of second calculators based on two series of second digital value sequences corresponding to the same second $\beta$ estimation signal to compute a second approximate $\beta$ value based on the estimated value of the second amplification degree $\beta2$, and the binarization section may acquire the third digital value sequence corresponding to a combination of each of the two or more of the plurality of first calculators and each of the two or more of the plurality of second calculators based on the first digital value sequence output from each of the two or more of the plurality of first calculators and the first approximate $\beta$ value and the second digital value sequence output from each of the two or more of the plurality of second calculators and the second approximate $\beta$ value.

According to a sixth aspect of the present invention, in the image capturing device of the fifth aspect, the plurality of first calculators and the plurality of second calculators may be divided into a plurality of groups so that each group includes a predetermined number of first calculators and a predetermined number of second calculators, the $\beta$ estimation section may compute the first approximate $\beta$ value corresponding to the group based on the estimated value of the first amplification degree $\beta1$ corresponding to a predetermined first calculator within the group, and the $\beta$ estimation section may compute the second approximate $\beta$ value corresponding to the group based on the estimated value of the second amplification degree $\beta2$ corresponding to a predetermined second calculator within the group.

DETAILED DESCRIPTION OF EXEMPLARY EMBODIMENTS

Hereinafter, embodiments of the present invention will be described with reference to the drawings.

First Embodiment

Figure 1:
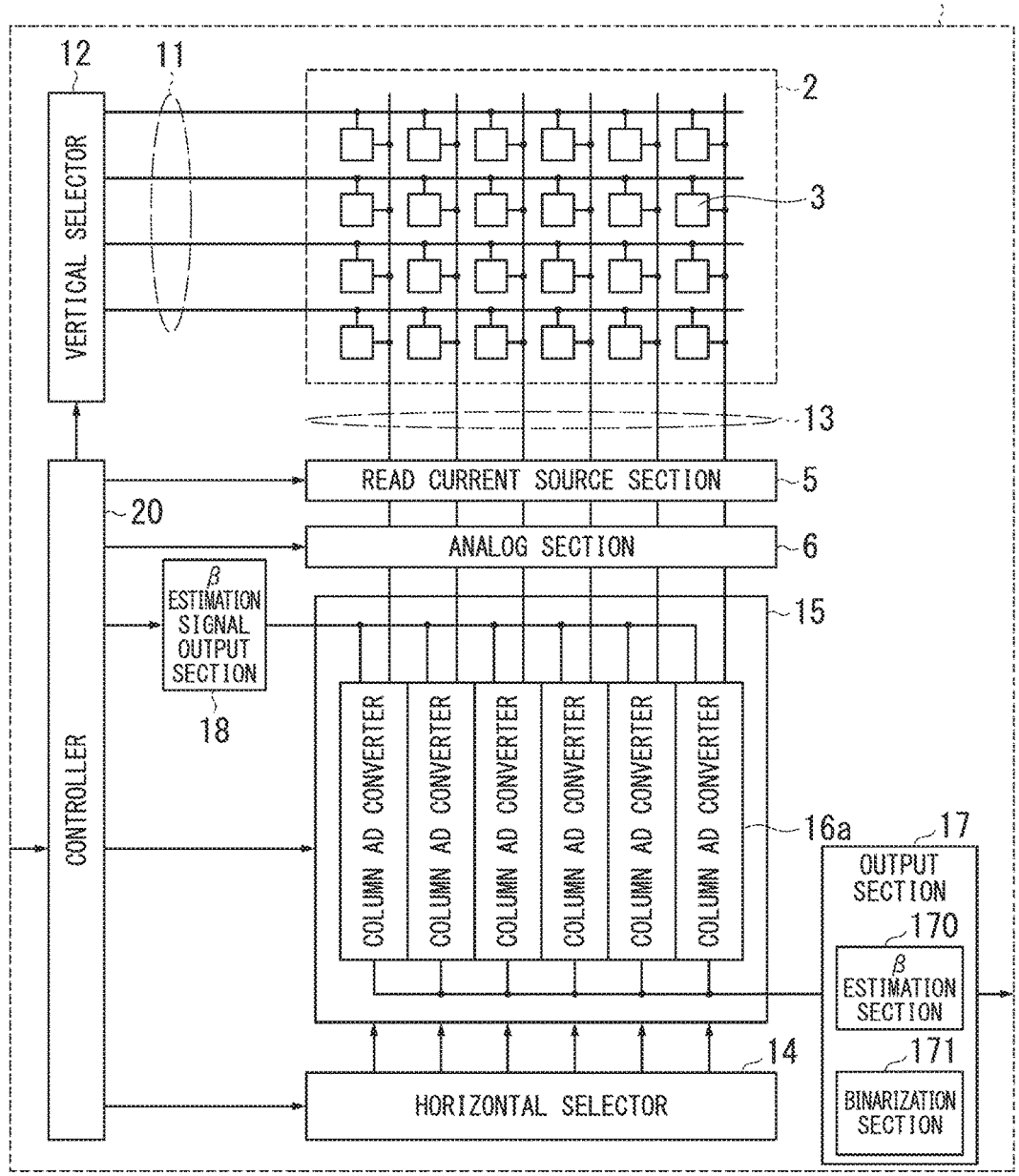
FIG. 1 is a block diagram showing a configuration of an image capturing device according to a first embodiment of the present invention.

First, the first embodiment of the present invention will be described. FIG. 1 shows an example of a configuration of an image capturing device according to this embodiment. The image capturing device 1a shown in FIG. 1 has an image capturing section 2, a vertical selector 12, a read current source section 5, an analog section 6, a β estimation signal output section 18, a column processing section 15, a horizontal selector 14, an output section 17, and a controller 20.

In the image capturing section 2, a plurality of section pixels 3, which are pixels configured to generate and output signals according to the amount of incident electromagnetic waves, are disposed in a matrix. The vertical selector 12 selects each row of the image capturing section 2. The read current source section 5 reads a signal from the image capturing section 2 as a voltage signal. The analog section 6 processes a pixel signal read from the image capturing section 2 in an analog manner. The β estimation signal output section 18 outputs a β estimation signal for estimating a value of an amplification degree β (1<β<2).

The column processing section 15 has a column AD converter 16a configured to perform AD conversion on a pixel signal processed by the analog section 6. The horizontal selector 14 reads digital data obtained through the AD conversion to a horizontal signal line. The output section 17 outputs binary data based on the digital data read to the horizontal signal line. The controller 20 controls each part.

Although the image capturing section 2 including section pixels 3 of 4 rows×6 columns has been described with reference to FIG. 1 for simplicity, several tens to several tens of thousands of section pixels 3 are actually disposed in each row or column of the image capturing section 2. Although not shown, the section pixels 3 constituting the image capturing section 2 include a photoelectric conversion element such as a photodiode, a photogate, or a phototransistor and a transistor circuit.

Hereinafter, the parts will be described in further detail. In the image capturing section 2, the section pixels 3 are two-dimensionally arranged only in 4 rows and 6 columns. In addition, a row control line 11 is wired for every row with respect to a pixel array of 4 rows and 6 columns. One end of the row control line 11 is connected to an output end corresponding to each row of the vertical selector 12. The vertical selector 12 includes a shift register, a decoder, or the like. The vertical selector 12 controls row addressing or row scanning of the image capturing section 2 via the row control line 11 when each section pixel 3 of the image capturing section 2 is driven. In addition, a vertical signal line 13 is wired for every column with respect to the pixel array of the image capturing section 2. That is, the image capturing section 2 has a plurality of section pixels 3 disposed in a matrix and outputs a pixel signal via the vertical signal line 13 connected to the section pixel 3 arranged in a vertical direction among the plurality of section pixels 3.

The read current source section 5, for example, is configured using an N-channel metal-oxide-semiconductor (NMOS) transistor. The vertical signal line 13 from the image capturing section 2 is connected to a drain terminal of the NMOS transistor constituting the read current source section 5. A desired voltage is appropriately applied to a control terminal, and a source terminal is connected to the ground (GND). Thereby, a pixel signal from the section pixel 3 is read in a voltage mode. Further, although the case in which the NMOS transistor is used as a current source has been described, it is unnecessary to limit the present invention thereto.

Although not described in detail, the analog section 6 performs a process (=correlated double sampling (CDS)) of taking a difference between a signal level (reset level) immediately after pixel reset and a true signal level with respect to a pixel signal of the voltage mode input via the vertical signal line 13. Thereby, a noise component referred to as fixed pattern noise (FPN), which is fixed variation for every pixel, or reset noise is removed. A CDS process may be performed in a digital domain by performing subtraction on a binary digital value sequence of the reset level and a binary digital value sequence of the signal level.

The β estimation signal output section 18 generates and outputs a β estimation signal having a voltage value substantially equal to a magnitude of a threshold value input to a comparator of the column AD converter 16a to be described below in order to estimate a value of the amplification degree β. In the column AD converter 16a to which the voltage value is supplied, the β estimation signal is a value for acquiring two series of base β digital value sequences of a base β digital value sequence having an MSB of 0 and a base β digital value sequence having an MSB of 1.

The column processing section 15, for example, has the column AD converter 16a provided for every pixel column of the image capturing section 2, that is, every vertical signal line 13. The column AD converter 16a performs cyclic AD conversion on the analog pixel signal or β estimation signal read via the vertical signal line 13 for each column from each section pixel 3 of the image capturing section 2 and outputs a base β digital value sequence which is a first digital value sequence corresponding to the pixel signal or β estimation signal. The column AD converter 16a is disposed in a column section corresponding to one column of the pixel array of the image capturing section 2.

The column processing section 15 of this embodiment is divided into a first circuit block and a second circuit block. The first circuit block includes column AD converters 16a disposed in odd columns and the second circuit block includes column AD converters 16a disposed in even columns. The column processing section 15 constitutes a digital-to-analog conversion means configured to convert an analog pixel signal output from the section pixel 3 of a selected row of the image capturing section 2 into digital pixel data along with the β estimation signal output section 18 and the output section 17.

The horizontal selector 14 includes a shift register, a decoder, or the like. The horizontal selector 14 controls column addressing or column scanning of the column AD converter 16a of the column processing section 15. According to control of the horizontal selector 14, a base β digital value sequence output from the column AD converter 16a is sequentially read to the horizontal signal line.

The output section 17 has a β estimation section 170 configured to estimate a value of the amplification degree β based on the base β digital value sequence when the β estimation signal is output and a binarization section 171 configured to acquire a binary digital value sequence which is a second digital value sequence (binary number), and outputs a binary digital value sequence. In addition, for example, a correction processing function or the like may be embedded in the output section 17. Further, the output section 17 may be configured to convert n-bit parallel digital data into serial data and output the serial data. A function of the output section 17 may be implemented by hardware, software, or a combination of hardware and software.

The controller 20 includes a functional block of a timing generator (TG), which supplies predetermined timing pulse signals or clocks necessary for operations of parts such as the vertical selector 12, the horizontal selector 14, the column processing section 15, the output section 17, and the β estimation signal output section 18 and a functional block for communicating with the TG.

Figure 2:
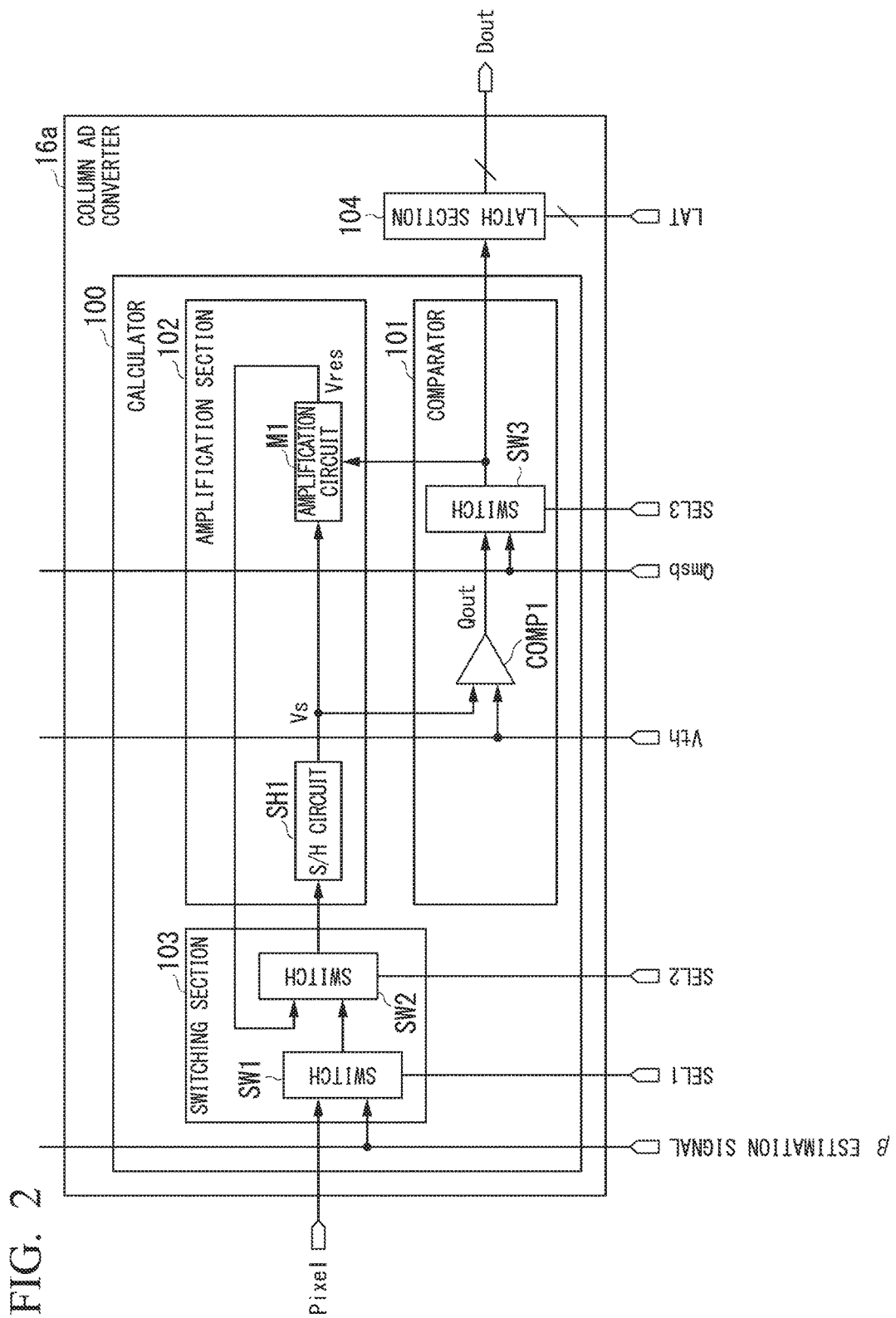
FIG. 2 is a block diagram showing a configuration of a column AD converter provided in the image capturing device according to the first embodiment of the present invention.

Next, details of a configuration of the column AD converter 16a will be described. The column AD converter 16a is disposed in correspondence with one column of the pixel array of the image capturing section 2. In FIG. 1, six column AD converters 16a are disposed. The column AD converters 16a of the columns are equally configured. FIG. 2 shows one example of the configuration of the column AD converter 16a. The column AD converter 16a has a calculator 100 including a comparator 101, an amplification section 102, and a switching section 103 and a latch section 104. The configuration of the calculator 100 is substantially similar to a configuration of an AD converter disclosed in Reference Literature (the publication of Japanese Unexamined Patent Application, First Publication No. 2013-70255).

The comparator 101 compares a magnitude of the first analog signal (sampling signal Vs) with a threshold value Vth to generate a digital value Qout according to a comparison result. The amplification section 102 amplifies the first analog signal (sampling signal Vs) by multiplying the first analog signal (sampling signal Vs) by the amplification degree β (1<β<2) and outputs a second analog signal (residual signal Vres) by executing computation according to the digital value Qout. The switching section 103 outputs one of a pixel signal Pixel and a β estimation signal as the first analog signal when an MSB of the first digital value sequence (base β digital value sequence) including a plurality of digital values Qout is computed, and outputs a second analog signal (residual signal Vres) as the first analog signal when a bit other than the MSB of the first digital value sequence (base β digital value sequence) is computed. The calculator 100 performs the cyclic AD conversion through these components and outputs a first digital value sequence (base β digital value sequence). The latch section 104 holds the first digital value sequence (base β digital value sequence).

Hereinafter, details of the configuration of the column AD converter 16a will be described. The comparator 101 has a comparison circuit COMP1 and a switch SW3. The comparison circuit COMP1 compares a magnitude of the sampling signal Vs which is the first analog signal output from the amplification section 102 with the threshold value Vth to generate a digital value Qout according to a comparison result. For example, the comparison circuit COMP1 outputs "1" as the digital value Qout when the sampling signal Vs is greater than the threshold value Vth and outputs "0" as the digital value Qout when the sampling signal Vs is less than the threshold value Vth.

The switch SW3 outputs one of the digital value Qout output from the comparison circuit COMP1 and a predetermined digital value Qmsb ("0" or "1"). Specifically, the switch SW3 outputs the digital value Qout when the first digital value sequence (base β digital value sequence) corresponding to the pixel signal Pixel is computed. In addition, the switch SW3 outputs the digital value Qmsb when an MSB of the first digital value sequence (base β digital value sequence) corresponding to the β estimation signal for estimating the value of the amplification degree β is computed. In addition, the switch SW3 outputs the digital value Qout when a bit other than the MSB of the first digital value sequence (base β digital value sequence) corresponding to the β estimation signal for estimating the value of the amplification degree β is computed. The state of the switch SW3 is controlled based on a control signal SEL3 from the controller 20.

The amplification section 102 has a sample/hold (S/H) circuit SH1 and an amplification circuit M1 (multiplying digital-analog converter (MDAC)). The S/H circuit SH1 samples and holds the first analog signal output from the switching section 103 and outputs a sampling signal Vs. The amplification circuit M1 amplifies the sampling signal Vs by multiplying the sampling signal Vs output from the S/H circuit SH1 by the amplification degree β and outputs a residual signal Vres which is the second analog signal by executing computation according to the digital value Qout or the digital value Qmsb output from the switch SW3.

Voltages of the sampling signal Vs and the residual signal Vres satisfy the following Formula (1-1).

$$Vres = \beta Vs \pm (\beta - 1) Vref \quad (1\text{-}1)$$

Formula (1-1) corresponds to Formula (10) disclosed in Reference Literature (the publication of Japanese Unexamined Patent Application, First Publication No. 2013-70255). Vref in Formula (1-1) is a voltage of a reference signal. According to the digital value Qout or the digital value Qmsb output from the switch SW3, +Vref or −Vref is selected. Accordingly, computation according to the digital value Qout or the digital value Qmsb to be executed by the amplification circuit M1 is voltage addition or subtraction according to the value of the amplification degree β and the voltage of the reference signal.

The switching section 103 has switches SW1 and SW2. The switch SW1 outputs one of the pixel signal Pixel and the β estimation signal. Specifically, the switch SW1 outputs the pixel signal Pixel when the first digital value sequence (base β digital value sequence) corresponding to the pixel signal Pixel is computed. In addition, the switch SW1 outputs the β estimation signal when the first digital value sequence (base β digital value sequence) corresponding to the β estimation signal is computed. The state of the switch SW1 is controlled based on a control signal SEL1 from the controller 20.

The switch SW2 outputs one of the signal output from the switching section 103 and the residual signal Vres output from the amplification circuit M1 as the first analog signal. Specifically, the switch SW2 outputs the pixel signal Pixel or the β estimation signal output from the switch SW1 as the first analog signal when the MSB of the first digital value sequence (base β digital value sequence) corresponding to the pixel signal Pixel or the β estimation signal is computed. In addition, the switch SW2 outputs the residual signal Vres output from the amplification circuit M1 as the first analog signal when a bit other than the MSB of the first digital value sequence (base β digital value sequence) corresponding to the pixel signal Pixel or the β estimation signal is computed. The state of the switch SW2 is controlled based on a control signal SEL2 from the controller 20.

The latch section 104 holds the first digital value sequence (base β digital value sequence) including the digital value Qout or Qmsb output from the switch SW3. Specifically, the latch section 104 holds the first digital value sequence (base β digital value sequence) including a plurality of digital values Qout output from the switch SW3 when the first digital value sequence (base β digital value sequence) corresponding to the pixel signal Pixel is computed. In addition, when the first digital value sequence (base β digital value sequence) corresponding to the β estimation signal is computed, the latch section 104 holds the first digital value sequence (base β digital value sequence) including the digital value Qmsb output from the switch SW3 as the MSB and a plurality of digital values Qout output from the switch SW3 as bits other than the MSB. An operation in which the latch section 104 holds the first digital value sequence (base β digital value sequence) is controlled based on a control signal LAT from the controller 20. The first digital value sequence (base β digital value sequence) held by the latch section 104 is output as a digital signal Dout.

The number of bits N of the base β digital value sequence which is the first digital value sequence is the number of bits for enabling a number of bits of desired resolution (for example, 14 bits) or more to be obtained when the base β digital value sequence is converted into a binary digital value sequence which is a second digital value sequence. In addition, the number of bits N is a value determined according to a value of an amplification degree β. As the value of the amplification degree β decreases, the number of bits necessary to obtain the desired resolution increases. In addition, the digital value capable of being held by the latch section 104 is a digital value having at least a number of bits necessary to estimate the value of the amplification degree β or more.

Although the pixel signal Pixel input to the column AD converter 16a is a signal after the CDS process is performed by the analog section 6 in this embodiment, the pixel signal Pixel input to the column AD converter 16a may be a signal of a reset level or a signal level read from the section pixel 3.

Although one column AD converter 16a is disposed in correspondence with one column of the pixel array of the image capturing section 2 in this embodiment, this is only an example. The present invention is not limited to this arrangement relation. For example, it is possible to adopt a configuration in which one column AD converter 16a can be disposed in correspondence with a plurality of columns of the pixel array of the image capturing section 2 and this one column AD converter 16a is used in time division among a plurality of columns of the pixel array of the image capturing section 2. Accordingly, it is only necessary to dispose the calculator 100 included in the column AD converter 16a in correspondence with one or more columns of an array of a plurality of pixels.

Although one β estimation signal output section 18 is disposed for the six calculators 100 in this embodiment, a plurality of β estimation signal output sections 18 may be disposed. When the plurality of β estimation signal output sections 18 are disposed, it is only necessary to dispose each β estimation signal output section 18 in correspondence with two or more of the plurality of calculators 100 included in the column AD converter 16a.

Although one β estimation section 170 is disposed for the six calculators 100 in this embodiment, a plurality of β estimation sections 170 may be disposed. When the plurality of β estimation sections 170 are disposed, it is only necessary to dispose each β estimation section 170 in correspondence with two or more of the plurality of calculators 100 included in the column AD converter 16a.

Although one binarization section 171 is disposed for the six calculators 100 in this embodiment, a plurality of binarization sections 171 may be disposed. When the plurality of binarization sections 171 are disposed, it is only necessary to dispose each binarization section 171 in correspondence with two or more of the plurality of calculators 100 included in the column AD converter 16a.

Although the β estimation section 170 and the binarization section 171 are disposed outside a region (column region) in which the column section corresponding to one column of the pixel array of the image capturing section 2 is disposed in this embodiment, the β estimation section 170 and the binarization section 171 may be disposed in the column region. Even in this case, it is only necessary to dispose the β estimation section 170 and the binarization section 171 in correspondence with two or more of the plurality of calculators 100 included in the column AD converter 16a in the column region. In addition, one of the β estimation section 170 and the binarization section 171 may be disposed in the column region and the other may be disposed outside the column region.

Figure 3:
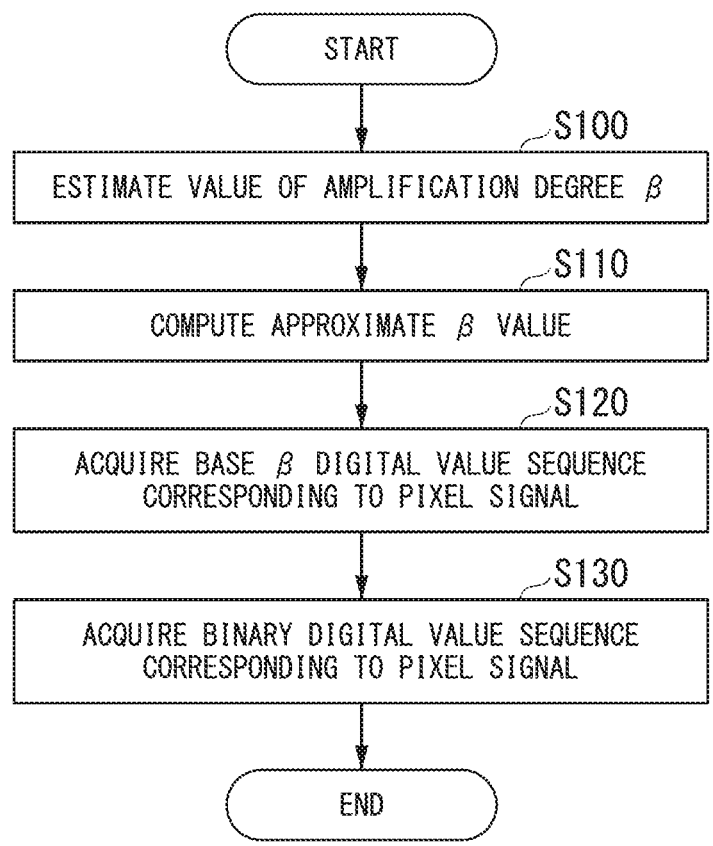
FIG. 3 is a flowchart showing a flow of processing according to AD conversion and binarization to be performed by the image capturing device according to the first embodiment of the present invention.

Next, a flow of processing according to AD conversion and binarization will be described. FIG. 3 shows the flow of the processing according to the AD conversion and the binarization.

<Step S100>

First, a value of an amplification degree β is estimated. As disclosed in Reference Literature (the publication of Japanese Unexamined Patent Application, First Publication No. 2013-70255), the estimation of the value of the amplification degree β is performed by acquiring two series of base β digital value sequences of a base β digital value sequence having an MSB of "0" and a base β digital value sequence having an MSB of "1" using a β estimation signal and finding a value of the amplification degree β in which a difference between the two series of acquired base β digital value sequences is minimized.

Specifically, the following process is performed. The calculator 100 acquires the two series of base β digital value sequences corresponding to the same β estimation signal. The β estimation signal, for example, is a signal having a voltage value substantially equal to a magnitude of a threshold value Vth of the comparison circuit COMP1. While the estimation of the value of the amplification degree β is performed, the switch SW1 outputs the β estimation signal.

When the MSB is computed, the switch SW2 outputs the β estimation signal output from the switch SW1 as a first analog signal. In addition, when a bit other than the MSB is computed, the switch SW2 outputs the residual signal Vres output from the amplification circuit M1 as the first analog signal.

The comparison circuit COMP1 compares a magnitude of a sampling signal Vs output from the S/H circuit SH1 with the threshold value Vth to generate a digital value Qout according to a comparison result. The switch SW3 outputs a digital value Qmsb when the MSB is computed. The digital value Qmsb is "0" when the base β digital value sequence having the MSB of "0" is acquired. In addition, the digital value Qmsb is "1" when the base β digital value sequence having the MSB of "1" is acquired. The switch SW3 outputs the digital value Qout when the bit other than the MSB is computed.

The amplification circuit M1 amplifies the sampling signal Vs by multiplying the sampling signal Vs output from the S/H circuit SH1 by the amplification degree β. Further, the amplification circuit M1 outputs the residual signal Vres by executing computation according to the digital value Qmsb output from the switch SW3 when the MSB is computed and executing computation according to the digital value Qout output from the switch SW3 when the bit other than the MSB is computed.

After sequentially outputting digital values constituting one of the two series of base β digital value sequences, the comparator 101 sequentially outputs digital values constituting the other of the two series of base β digital value sequences. The latch section 104 holds the two series of base β digital value sequences and outputs the held base β digital value sequences as a digital signal Dout. The MSB of the two series of base β digital value sequences is the digital value Qmsb and the bit other than the MSB of the two series of base β digital value sequences is the digital value Qout.

The β estimation section 170 estimates the value of the amplification degree β based on the two series of base β digital value sequences output from the latch section 104. Specifically, the β estimation section 170 obtains a value $e(\beta)$ by sequentially substituting β into the following Formula (1-2) and obtains a value of β with which an absolute value of the value $e(\beta)$ is minimized. In Formula (1-2), $b_{1i}$ is each bit value of the base β digital value sequence having the MSB of "1" and $b_{0i}$ is each bit value of the base β digital value sequence having an MSB of "0."

$$e(\beta) = \sum_{i=1}^{N} b_{1i}\beta^{-i} - \sum_{i=1}^{N} b_{0i}\beta^{-i} \qquad (1\text{-}2)$$

The β estimation section 170 performs the above-described process based on the two series of base β digital value sequences computed by each of the six calculators 100 to estimate values of amplification degrees $\beta_1$ to $\beta_6$ corresponding to the six calculators 100.

<Step S110>

After the value of the amplification degree β is estimated, an approximate β value for approximating a plurality of amplification degrees β is computed. Specifically, the following process is performed. The β estimation section 170 computes the approximate β value based on the estimated values of the amplification degrees $\beta_1$ to $\beta_6$ corresponding to the six calculators 100. In this embodiment, the six calculators 100 are divided into a plurality of groups (a first circuit block and a second circuit block) so that each group includes two or more calculators 100. The β estimation section 170 computes the approximate β value corresponding to each group based on the estimated values of the amplification degrees β corresponding to the two or more calculators 100 within the group. That is, the β estimation section 170 computes the approximate β value for each group. Specifically, the β estimation section 170 computes an approximate β value β(1) corresponding to the first circuit block based on values of the amplification degrees $\beta_1$, $\beta_3$, and $\beta_5$ corresponding to three calculators 100 included in the first circuit block and computes an approximate β value β(2) corresponding to the second circuit block based on values of the amplification degrees $\beta_2$, $\beta_4$, and $\beta_6$ corresponding to three calculators 100 included in the second circuit block.

For example, the β estimation section 170 computes the approximate β values β(1) and β(2) by performing computation indicated by the following Formulas (1-3) and (1-4). In this example, each of the approximate β values β(1) and β(2) is the average value of estimated values of a plurality of amplification degrees β.

$$\beta(1) = (\alpha_1 \alpha_3 \alpha_5)\begin{pmatrix} \beta_1 \\ \beta_3 \\ \beta_5 \end{pmatrix} = \sum_{n=1}^{3} \alpha_{2n-1} \times \beta_{2n-1} \qquad (1\text{-}3)$$

where $$\sum_{n=1}^{3} \alpha_{2n-1} = 1.$$

$$\beta(2) = (\alpha_2 \alpha_4 \alpha_6)\begin{pmatrix} \beta_2 \\ \beta_4 \\ \beta_6 \end{pmatrix} = \sum_{n=1}^{3} \alpha_{2n} \times \beta_{2n} \qquad (1\text{-}4)$$

where $$\sum_{n=1}^{3} \alpha_{2n} = 1.$$

When the approximate β values β(1) and β(2) are computed as average values which are not weighted, a coefficient $(\alpha_1, \alpha_3, \alpha_5)$ of Formula (1-3) is expressed by the following Formula (1-5) and a coefficient $(\alpha_2, \alpha_4, \alpha_6)$ of Formula (1-4) is expressed by the following Formula (1-6).

$$(\alpha_1, \alpha_3, \alpha_5) = (1/3, 1/3, 1/3) \qquad (1\text{-}5)$$

$$(\alpha_2, \alpha_4, \alpha_6) = (1/3, 1/3, 1/3) \qquad (1\text{-}6)$$

The above is an example and the present invention is not limited thereto. For example, the following Formula (1-7) may be used instead of Formula (1-5) and the following Formula (1-8) may be used instead of Formula (1-6). In this case, only the values of the amplification degrees $\beta_3$ and $\beta_4$ may be estimated.

$$(\alpha_1, \alpha_3, \alpha_5) = (0, 1, 0) \qquad (1\text{-}7)$$

$$(\alpha_2, \alpha_4, \alpha_6) = (0, 1, 0) \qquad (1\text{-}8)$$

<Step S120>

After the approximate β value is computed, a base β digital value sequence corresponding to a pixel signal Pixel is acquired. Specifically, the following process is performed. While the base β digital value sequence corresponding to the pixel signal Pixel is acquired, the switch SW1 outputs the pixel signal Pixel.

When the MSB is computed, the switch SW2 outputs the pixel signal Pixel output from the switch SW1 as a first analog signal. In addition, when a bit other than the MSB is computed, the switch SW2 outputs the residual signal Vres output from the amplification circuit M1 as the first analog signal.

The comparison circuit COMP1 compares a magnitude of a sampling signal Vs output from the S/H circuit SH1 with the threshold value Vth to generate a digital value Qout according to a comparison result. The switch SW3 outputs the digital value Qout.

The amplification circuit M1 amplifies the sampling signal Vs by multiplying the sampling signal Vs output from the S/H circuit SH1 by the amplification degree β. Further, the amplification circuit M1 outputs the residual signal Vres by executing computation according to the digital value Qout output from the switch SW3.

The comparator 101 sequentially outputs the digital value Qout constituting the base β digital value sequence. The latch section 104 holds the base β digital value sequence and outputs the held base β digital value sequence as a digital signal Dout. The MSB of the base β digital value sequence is the digital value Qout according to the comparison result of the magnitude of the pixel signal Pixel and the threshold value Vth, and the bit other than the MSB of the base β digital value sequence is the digital value Qout according to the comparison result of the magnitude of the residual signal Vres and the threshold value Vth.

<Step S130>

After the base β digital value sequence corresponding to the pixel signal Pixel is acquired, a binary digital value sequence corresponding to the pixel signal Pixel is acquired. At this time, a process in which the base β digital value sequence is considered to be an approximate base β digital value sequence having an approximate β value as a base is performed. Specifically, the following process is performed. The binarization section 171 acquires binary digital value sequences corresponding to two or more of the six calculators 100 based on the base β digital value sequence and the approximate β value output from each of the two or more of the six calculators 100.

Specifically, the binarization section 171 acquires a binary digital value sequence corresponding to each of the calculators 100 included in the first circuit block based on the base β digital value sequence output from each of the calculators 100 included in the first circuit block and the approximate β value β(1) corresponding to the first circuit block. Because three calculators 100 are included in the first circuit block, three binary digital value sequences are acquired.

In addition, the binarization section 171 acquires a binary digital value sequence corresponding to each of the calculators 100 included in the second circuit block based on the base β digital value sequence output from each of the calculators 100 included in the second circuit block and the approximate β value β(2) corresponding to the second circuit block. Because three calculators 100 are included in the second circuit block, three binary digital value sequences are acquired. Therefore, six binary digital value sequences corresponding to six base β digital value sequences acquired by the six calculators 100 are acquired.

Through the above-described process, the binary digital value sequence corresponding to the pixel signals output from the section pixels 3 of one row of the pixel array of the image capturing section 2 is acquired. It is possible to acquire binary digital value sequences corresponding to pixel signals output from all the section pixels 3 of the image capturing section 2 by performing the process of steps S120 and S130 following an operation in which the pixel signals are sequentially read for every row.

According to this embodiment, an image capturing device 1a includes an image capturing section 2 having a plurality of pixels (section pixels 3) disposed in a matrix and configured to output a pixel signal Pixel via a first signal line (vertical signal line 13) connected to pixels (section pixels 3) arranged in a first direction (vertical direction) among the plurality of pixels (section pixels 3); a plurality of calculators 100, which are calculators 100 configured to perform cyclic AD conversion, each including: a comparator 101 configured to compare a magnitude of a first analog signal (sampling signal Vs) with a threshold value Vth to generate a digital value Qout according to a comparison result; an amplification section 102 configured to amplify the first analog signal (sampling signal Vs) by multiplying the first analog signal (sampling signal Vs) by an amplification degree β ($1<\beta<2$) and output a second analog signal (residual signal Vres) by executing computation according to the digital value Qout; and a switching section 103 configured to output one of the pixel signal Pixel and a β estimation signal for estimating a value of the amplification degree β as the first analog signal when an MSB of the first digital value sequence (base β digital value sequence) including a plurality of digital values Qout is computed, and output the second analog signal (residual signal Vres) as the first analog signal when a bit other than the MSB of the first digital value sequence (base β digital value sequence) is computed, the plurality of first calculators 100 outputting the first digital value sequence (base β digital value sequence); a latch section 104 configured to latch the first digital value sequence (base β digital value sequence); a β estimation signal output section 18 configured to output the β estimation signal; a β estimation section 170 configured to estimate a value of the amplification degree β based on the first digital value sequence (base β digital value sequence) when the β estimation signal is output as the first analog signal; and a binarization section 171 configured to acquire a second digital value sequence (binary digital value sequence) which is a binary number, based on the first digital value sequence (base β digital value sequence) and the estimated value of the amplification degree β; wherein the plurality of calculators 100 are disposed one by one in correspondence with one or more columns of an array of the plurality of pixels (section pixels 3); wherein the β estimation signal output section 18 is disposed in correspondence with two or more of the plurality of calculators 100; wherein the β estimation section 170 is disposed in correspondence with two or more of the plurality of calculators 100; and wherein the binarization section 171 is disposed in correspondence with two or more of the plurality of calculators 100.

Because the β estimation signal output section 18, the β estimation section 170, and the binarization section 171 are disposed in correspondence with two or more of the plurality of calculators 100, circuits of the β estimation signal output section 18, the β estimation section 170, and the binarization section 171 are disposed in correspondence with a plurality of columns of an array of the plurality of pixels (section pixels 3). For example, for the circuits, a region for the plurality of columns of the array of the plurality of pixels (section pixels 3) may be allocated. Thus, even when the circuit scale of an element constituting the cyclic AD conversion circuit is large, it is possible to configure an image capturing device in which the cyclic AD conversion circuit is disposed.

In addition, according to this embodiment, in the image capturing device 1a, when the second digital value sequence (binary digital value sequence) corresponding to the pixel signal is acquired, the β estimation section 170 estimates the value of the amplification degree β corresponding to a predetermined calculator 100 based on two series of first digital value sequences (base β digital value sequences) corresponding to the same β estimation signal to compute an approximate β value based on the estimated value of the amplification degree β, and the binarization section 171 acquires the second digital value sequence (binary digital value sequence) corresponding to each of the two or more of the plurality of calculators 100 based on the first digital value sequence (base β digital value sequence) and the approximate β value output from each of the two or more of the plurality of calculators 100.

When the first digital value sequence (base β digital value sequence) acquired by each of the plurality of calculators 100 is converted into the second digital value sequence (binary digital value sequence), the circuit scale becomes huge in the image capturing device configured to perform the conversion using a value of the amplification degree β corresponding to each of the plurality of calculators 100. As in this embodiment, it is possible to reduce the circuit scale in the image capturing device configured to perform the conversion using the approximate β value (average value or the like) for the value of the amplification degree β corresponding to each of the plurality of calculators 100.

In addition, according to this embodiment, in the image capturing device 1a, the plurality of calculators 100 are divided into a plurality of groups (first and second circuit blocks) so that each group includes a predetermined number of calculators 100, and the β estimation section 170 computes the approximate β value corresponding to the group based on the estimated value of the amplification degree β corresponding to a predetermined calculator 100 within the group.

In general, a color filter is disposed in a surface of a pixel constituting the image capturing section. According to an arrangement of color filters, for example, signals of pixels having color filters of the same color are configured to be output to the same group of the calculators 100, so that it is possible to compute an approximate β value suitable for each pixel.

Second Embodiment

Figure 4:
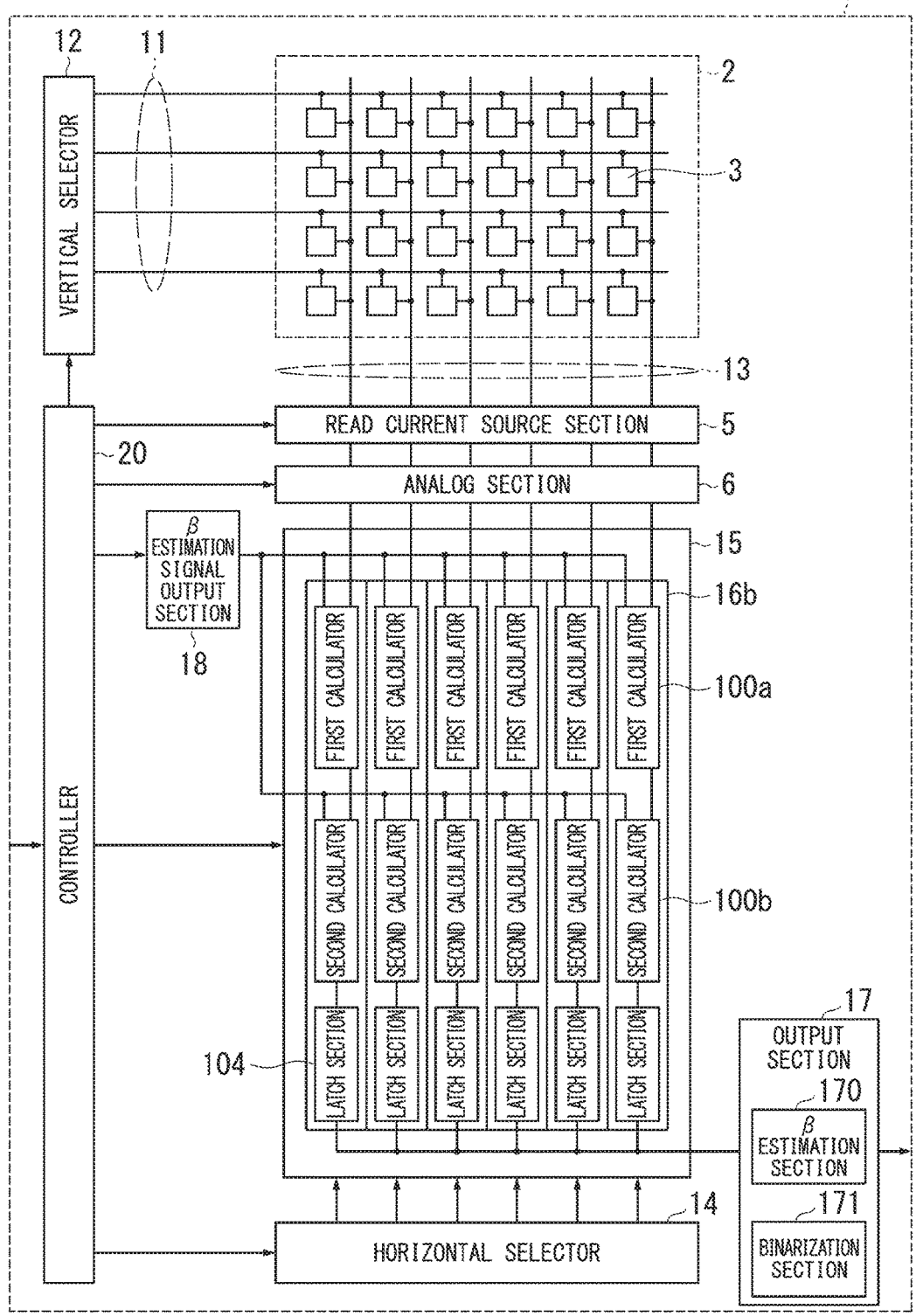
FIG. 4 is a block diagram showing a configuration of an image capturing device according to a second embodiment of the present invention.

Next, the second embodiment of the present invention will be described. FIG. 4 shows an example of a configuration of an image capturing device according to this embodiment. The image capturing device 1b shown in FIG. 4 has an image capturing section 2, a vertical selector 12, a read current source section 5, an analog section 6, a β estimation signal output section 18, a column processing section 15, a horizontal selector 14, an output section 17, and a controller 20. The column processing section 15 has a column AD converter 16b configured to perform AD conversion on a pixel signal processed by the analog section 6. Because the components other than the column AD converter 16b are substantially similar to those of the image capturing device 1a shown in FIG. 1, a description thereof will be omitted.

The column AD converter 16b is disposed in correspondence with one row of an array of a plurality of pixels. In FIG. 4, six column AD converters 16b are disposed. The column AD converters 16b of the columns are equally configured. The column AD converter 16b includes a first calculator 100a, a second calculator 100b, and a latch section 104. When an N-bit base β digital value sequence corresponding to an analog signal is acquired in this embodiment, the first calculator 100a computes a digital value having $N^{th}$ (MSB) to $N-k+1^{th}$ bits which are upper bits and the second calculator 100b computes a digital value having $N-k^{th}$ to first bits which are lower bits.

Figure 5:
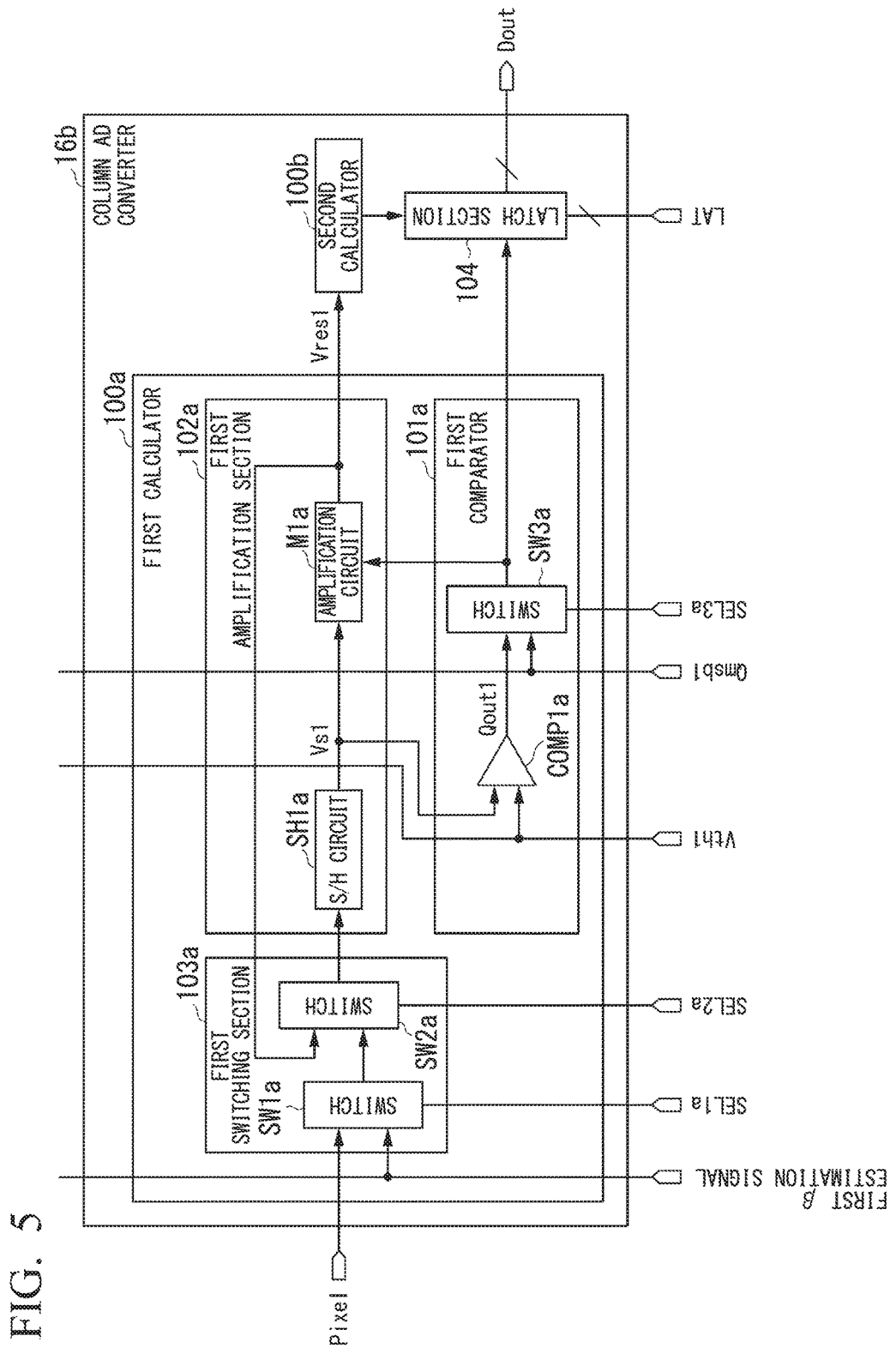
FIG. 5 is a block diagram showing a configuration of a first calculator provided in the image capturing device according to the second embodiment of the present invention.

FIG. 5 shows an example of a configuration of the first calculator 100a. The first calculator 100a includes a first comparator 101a, a first amplification section 102a, and a first switching section 103a. The configuration of the first calculator 100a is substantially similar to that of the calculator 100 in the first embodiment.

The first comparator 101a compares a magnitude of the first analog signal (first sampling signal Vs1) with a first threshold value Vth1 to generate a first digital value Qout1 according to a comparison result. The first amplification section 102a amplifies the first analog signal (first sampling signal Vs1) by multiplying the first analog signal (first sampling signal Vs1) by the first amplification degree β1 (1<β1<2) and outputs a second analog signal (first residual signal Vres1) by executing computation according to the first digital value Qout1. The first switching section 103a outputs one of a pixel signal Pixel and a first β estimation signal as the first analog signal when an MSB of the first digital value sequence (first base β digital value sequence) including a plurality of first digital values Qout1 is computed, and outputs a second analog signal (first residual signal Vres1) as the first analog signal when a bit other than the MSB of the first digital value sequence (first base β digital value sequence) is computed. The latch section 104 holds the first digital value sequence (first base β digital value sequence) output from the first calculator 100a.

Hereinafter, details of the configuration of the column AD converter 16b will be described. The first comparator 101a has a comparison circuit COMP1a and a switch SW3a. The comparison circuit COMP1a compares a magnitude of the first sampling signal Vs1 which is the first analog signal output from the first amplification section 102a with the first threshold value Vth1 to generate a first digital value Qout1 according to a comparison result. For example, the comparison circuit COMP1a outputs "1" as the first digital value Qout1 when the first sampling signal Vs1 is greater than the first threshold value Vth1 and outputs "0" as the first digital value Qout1 when the first sampling signal Vs1 is less than the first threshold value Vth1.

The switch SW3a outputs one of the first digital value Qout1 output from the comparison circuit COMP1a and a predetermined first digital value Qmsb1 ("0" or "1"). Specifically, the switch SW3a outputs the first digital value Qout1 when the first digital value sequence (first base β digital value sequence) corresponding to the pixel signal Pixel is computed. In addition, the switch SW3a outputs the first digital value Qmsb1 when an MSB of the first digital value sequence (first base β digital value sequence) corresponding to the first β estimation signal for estimating the value of the first amplification degree β1 is computed. In addition, the switch SW3a outputs the first digital value Qout1 when a bit other than the MSB of the first digital value sequence (first base β digital value sequence) corresponding to the first β estimation signal for estimating the value of the first amplification degree β1 is computed. The state of the switch SW3a is controlled based on a control signal SEL3a from the controller 20.

The first amplification section 102a has an S/H circuit SH1a and an amplification circuit M1a (MDAC). The S/H circuit SH1a samples and holds the first analog signal output from the first switching section 103a and outputs the first sampling signal Vs1. The amplification circuit M1a amplifies the first sampling signal Vs1 by multiplying the first sampling signal Vs1 output from the S/H circuit SH1a by the first amplification degree β1 and outputs a first residual signal Vres1 which is the second analog signal by executing computation according to the first digital value Qout1 or the first digital value Qmsb1 output from the switch SW3a. The first residual signal Vres1 is output to the first switching section 103a and the second calculator 100b.

Voltages of the first sampling signal Vs1 and the first residual signal Vres1 satisfy a similar relation to the above-described Formula (1-1). Computation according to the first digital value Qout1 or the first digital value Qmsb1 to be executed by the amplification circuit M1a is voltage addition or subtraction according to the value of the first amplification degree β1 and the voltage of a reference signal.

The first switching section 103a has switches SW1a and SW2a. The switch SW1a outputs one of the pixel signal Pixel and the first β estimation signal. Specifically, the switch SW1a outputs the pixel signal Pixel when the first digital value sequence (first base β digital value sequence) corresponding to the pixel signal Pixel is computed. In addition, the switch SW1a outputs the first β estimation signal when the first digital value sequence (first base β digital value sequence) corresponding to the first β estimation signal is computed. The state of the switch SW1a is controlled based on a control signal SEL1a from the controller 20.

The switch SW2a outputs one of the signal output from the switch SW1a and the first residual signal Vres1 output from the amplification circuit M1a as the first analog signal. Specifically, the switch SW2a outputs the pixel signal Pixel or the first β estimation signal output from the switch SW1a as the first analog signal when the MSB of the first digital value sequence (first base β digital value sequence) corresponding to the pixel signal Pixel or the first β estimation signal is computed. In addition, the switch SW2a outputs the first residual signal Vres1 output from the amplification circuit M1a as the first analog signal when a bit other than the MSB of the first digital value sequence (first base β digital value sequence) corresponding to the pixel signal Pixel or the first β estimation signal is computed. The state of the switch SW2a is controlled based on a control signal SEL2a from the controller 20.

The latch section 104 holds the first digital value sequence (first base β digital value sequence) including the first digital value Qout1 or Qmsb1 output from the switch SW3a. Specifically, the latch section 104 holds the first digital value sequence (first base β digital value sequence) including a plurality of first digital values Qout1 output from the switch SW3a when the first digital value sequence (first base β digital value sequence) corresponding to the pixel signal Pixel is computed. In addition, when the first digital value sequence (first base β digital value sequence) corresponding to the first β estimation signal is computed, the latch section 104 holds the first digital value sequence (first base β digital value sequence) including the first digital value Qmsb1 output from the switch SW3a as the MSB and a plurality of first digital values Qout1 output from the switch SW3a as bits other than the MSB. An operation in which the latch section 104 holds the first digital value sequence (first base β digital value sequence) is controlled based on the control signal LAT from the controller 20. The first digital value sequence (first base β digital value sequence) held by the latch section 104 is output as a digital signal Dout.

Figure 6:
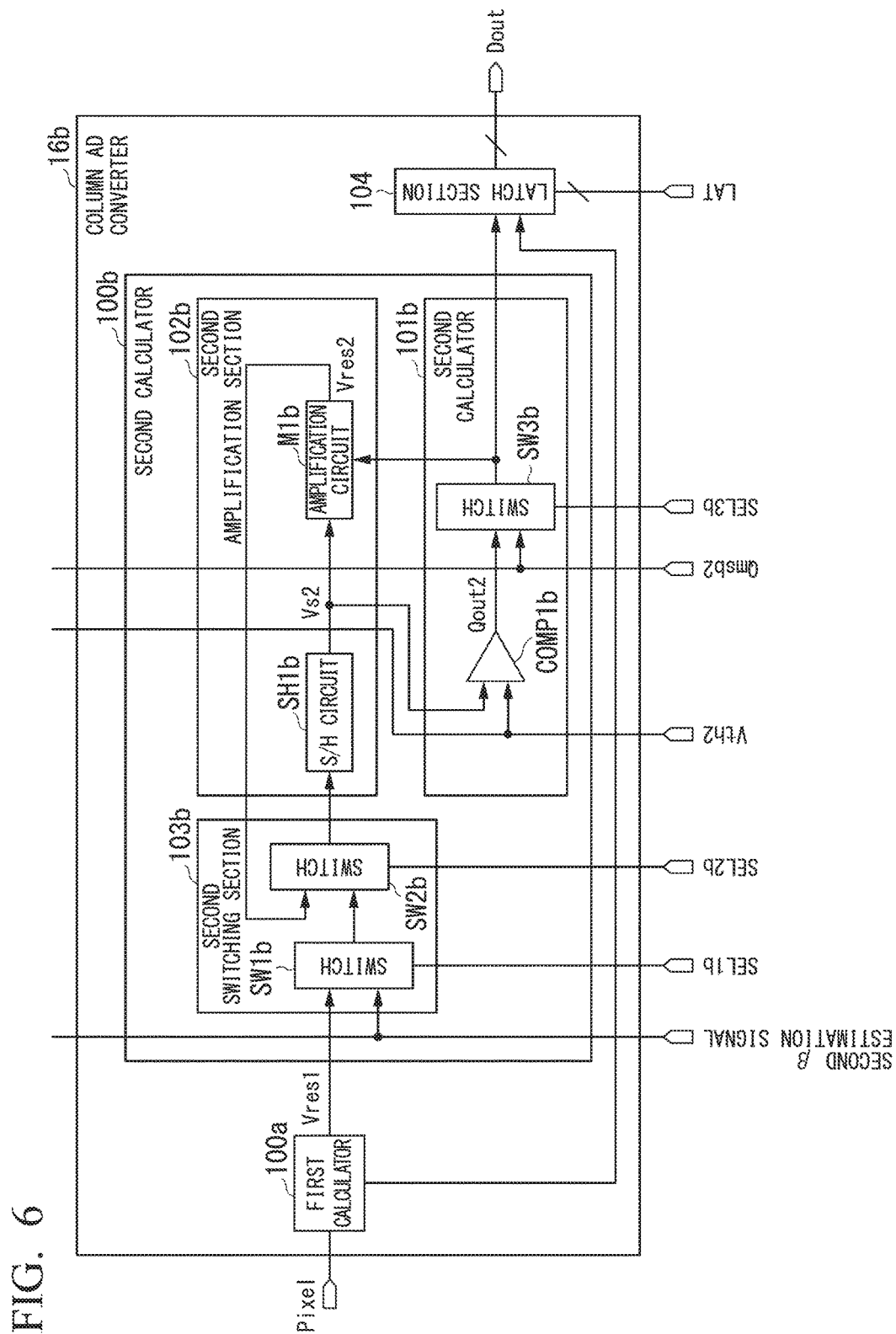
FIG. 6 is a block diagram showing a configuration of a second calculator provided in the image capturing device according to the second embodiment of the present invention.

FIG. 6 shows an example of a configuration of the second calculator 100b. The second calculator 100b includes a second comparator 101b, a second amplification section 102b, and a second switching section 103b. The configuration of the second calculator 100b is substantially similar to that of the calculator 100 in the first embodiment.

The second comparator 101b compares a magnitude of the second analog signal (second sampling signal Vs2) with a second threshold value Vth2 to generate a second digital value Qout2 according to a comparison result. The second amplification section 102b amplifies the third analog signal (second sampling signal Vs2) by multiplying the third analog signal (second sampling signal Vs2) by the second amplification degree β2 (1<β<2) and outputs a fourth analog signal (second residual signal Vres2) by executing computation according to the second digital value Qout2. The second switching section 103b outputs one of the second analog (first residual signal Vres1) and a second β estimation signal as the third analog signal when an MSB of the second digital value sequence (second base β digital value sequence) including a plurality of second digital values Qout2 is computed, and outputs a fourth analog signal (second residual signal Vres2) as the third analog signal when a bit other than the MSB of the second digital value sequence (second base β digital value sequence) is computed. The latch section 104 holds the second digital value sequence (second base β digital value sequence) output from the second calculator 100b.

Hereinafter, details of the configuration of the column AD converter 16b will be described. The second comparator 101b has a comparison circuit COMP1b and a switch SW3b. The comparison circuit COMP1b compares a magnitude of the second sampling signal Vs2 which is the third analog signal output from the second amplification section 102b with the second threshold value Vth2 to generate a second digital value Qout2 according to a comparison result. For example, the comparison circuit COMP1b outputs "1" as the second digital value Qout2 when the second sampling signal Vs2 is greater than the second threshold value Vth2 and outputs "0" as the second digital value Qout2 when the second sampling signal Vs2 is less than the second threshold value Vth2.

The switch SW3b outputs one of the second digital value Qout2 output from the comparison circuit COMP1b and a predetermined second digital value Qmsb2 ("0" or "1"). Specifically, the switch SW3b outputs the second digital value Qout2 when the second digital value sequence (second base β digital value sequence) corresponding to the pixel signal Pixel is computed. In addition, the switch SW3b outputs the second digital value Qmsb2 when an MSB of the second digital value sequence (second base β digital value sequence) corresponding to the second β estimation signal for estimating the value of the second amplification degree β2 is computed. In addition, the switch SW3b outputs the second digital value Qout2 when a bit other than the MSB of the second digital value sequence (second base β digital value sequence) corresponding to the second β estimation signal for estimating the value of the second amplification degree β2 is computed. The state of the switch SW3b is controlled based on a control signal SEL3b from the controller 20.

The second amplification section 102b has an S/H circuit SH1b and an amplification circuit M1b (MDAC). The S/H circuit SH1b samples and holds the third analog signal output from the second switching section 103b and outputs the second sampling signal Vs2. The amplification circuit M1b amplifies the second sampling signal Vs2 by multiplying the second sampling signal Vs2 output from the S/H circuit SH1b by the second amplification degree β2 and outputs a second residual signal Vres2 which is the fourth analog signal by executing computation according to the second digital value Qout2 or the second digital value Qmsb2 output from the switch SW3*b*.

Voltages of the second sampling signal Vs2 and the second residual signal Vres2 satisfy a similar relation to the above-described Formula (1-1). Computation according to the second digital value Qout2 or the second digital value Qmsb2 to be executed by the amplification circuit M1*b* is voltage addition or subtraction according to the value of the second amplification degree $\beta 2$ and the voltage of the reference signal.

The second switching section 103*b* has switches SW1*b* and SW2*b*. The switch SW1*b* outputs one of the first residual signal Vres1 and the second β estimation signal. Specifically, the switch SW1*b* outputs the first residual signal Vres1 when the second digital value sequence (second base β digital value sequence) corresponding to the pixel signal Pixel is computed. In addition, the switch SW1*b* outputs the second β estimation signal when the second digital value sequence (second base β digital value sequence) corresponding to the second β estimation signal is computed. The state of the switch SW1*b* is controlled based on a control signal SEL1*b* from the controller 20.

The switch SW2*b* outputs one of the signal output from the switch SW1*b* and the second residual signal Vres2 output from the amplification circuit M1*b* as the third analog signal. Specifically, the switch SW2*b* outputs the first residual signal Vres1 or the second β estimation signal output from the switch SW1*b* as the third analog signal when the MSB of the second digital value sequence (second base β digital value sequence) corresponding to the pixel signal Pixel or the second β estimation signal is computed. In addition, the switch SW2*b* outputs the second residual signal Vres2 output from the amplification circuit M1*b* as the third analog signal when a bit other than the MSB of the second digital value sequence (second base β digital value sequence) corresponding to the pixel signal Pixel or the second β estimation signal is computed. The state of the switch SW2*b* is controlled based on a control signal SEL2*b* from the controller 20.

The latch section 104 holds the second digital value sequence (second base β digital value sequence) including the second digital value Qout2 or Qmsb2 output from the switch SW3*b*. Specifically, the latch section 104 holds the second digital value sequence (second base β digital value sequence) including a plurality of second digital values Qout2 output from the switch SW3*b* when the second digital value sequence (second base β digital value sequence) corresponding to the pixel signal Pixel is computed. In addition, when the second digital value sequence (second base β digital value sequence) corresponding to the second β estimation signal is computed, the latch section 104 holds the second digital value sequence (second base β digital value sequence) including the second digital value Qmsb2 output from the switch SW3*b* as the MSB and a plurality of second digital values Qout2 output from the switch SW3*b* as bits other than the MSB. An operation in which the latch section 104 holds the second digital value sequence (second base β digital value sequence) is controlled based on the control signal LAT from the controller 20. The second digital value sequence (second base β digital value sequence) held by the latch section 104 is output as a digital signal Dout.

The number of bits N of the digital value sequence constituted of the first digital value sequence (first base β digital value sequence) and the second digital value sequence (second base β digital value sequence) held by the latch section 104 is the number of bits for enabling a number of bits of desired resolution (for example, 14 bits) or more to be obtained when the digital value sequence is converted into a third digital value sequence (binary digital value sequence). In addition, the number of bits N is a value determined according to values of the first amplification degree $\beta 1$ and the second amplification degree $\beta 2$. As the value of the first amplification degree $\beta 1$ decreases or the value of the second amplification degree $\beta 2$ decreases, the number of bits necessary to obtain the desired resolution increases. In addition, the digital value capable of being held by the latch section 104 is a digital value having at least a number of bits necessary to estimate the values of the first amplification degree $\beta 1$ and the second amplification degree $\beta 2$ or more.

The β estimation signal output section 18 outputs the first β estimation signal for estimating the value of the first amplification degree $\beta 1$ and the second β estimation signal for estimating the value of the second amplification degree $\beta 2$. As an example, the first β estimation signal and the second β estimation signal are the same signal.

The β estimation section 170 estimates the value of the first amplification degree $\beta 1$ based on the first digital value sequence (first base β digital value sequence) when the first β estimation signal is output as the first analog signal and estimates the value of the second amplification degree $\beta 2$ based on the second digital value sequence (second base β digital value sequence) when the second β estimation signal is output as the third analog signal. The binarization section 171 acquires the third digital value sequence (binary digital value sequence) which is a binary number, based on the first digital value sequence (first base β digital value sequence), the estimated value of the first amplification degree $\beta 1$, the second digital value sequence (second base β digital value sequence), and the estimated value of the second amplification degree $\beta 2$.

Although the pixel signal Pixel input to the column AD converter 16*b* is a signal after the CDS process is performed by the analog section 6 in this embodiment, the pixel signal Pixel input to the column AD converter 16*b* may be a signal of a reset level or a signal level read from the section pixel 3.

Although one column AD converter 16*b* is disposed in correspondence with one column of the pixel array of the image capturing section 2 in this embodiment, this is only an example. The present invention is not limited to this arrangement relation. For example, it is possible to adopt a configuration in which one column AD converter N 16*b* can be disposed in correspondence with a plurality of columns of the pixel array of the image capturing section 2 and this one column AD converter 16*b* is used in time division among a plurality of columns of the pixel array of the image capturing section 2. Accordingly, it is only necessary that the first calculator 100*a* and the second calculator 100*b* included in the column AD converter 16*b* be disposed in correspondence with one or more columns of an array of a plurality of pixels.

Although one β estimation signal output section 18 is disposed for the six second calculators 100*b* in this embodiment, a plurality of β estimation signal output sections 18 may be disposed. When the plurality of β estimation signal output sections 18 are disposed, it is only necessary that each β estimation signal output section 18 be disposed in correspondence with two or more of the plurality of second calculators 100*b* included in the column AD converter 16*b*.

Although one β estimation section 170 is disposed for the six second calculators 100*b* in this embodiment, a plurality of β estimation sections 170 may be disposed. When the plurality of β estimation sections 170 are disposed, it is only necessary that each β estimation section 170 be disposed in correspondence with two or more of the plurality of second calculators 100*b* included in the column AD converter 16*b*.

Although one binarization section 171 is disposed for the six second calculators 100*b* in this embodiment, a plurality of binarization sections 171 may be disposed. When the plurality of binarization sections 171 are disposed, it is only necessary that each binarization section 171 be disposed in correspondence with two or more of the plurality of second calculators 100*b* included in the column AD converter 16*b*.

Although the β estimation section 170 and the binarization section 171 are disposed outside a region (column region) in which the column section corresponding to one column of the pixel array of the image capturing section 2 is disposed in this embodiment, the β estimation section 170 and the binarization section 171 may be disposed in the column region. Even in this case, it is only necessary that the β estimation section 170 and the binarization section 171 be disposed in correspondence with two or more of the plurality of second calculators 100*b* included in the column AD converter 16*b* in the column region. In addition, one of the β estimation section 170 and the binarization section 171 may be disposed in the column region and the other may be disposed outside the column region.

Figure 7:
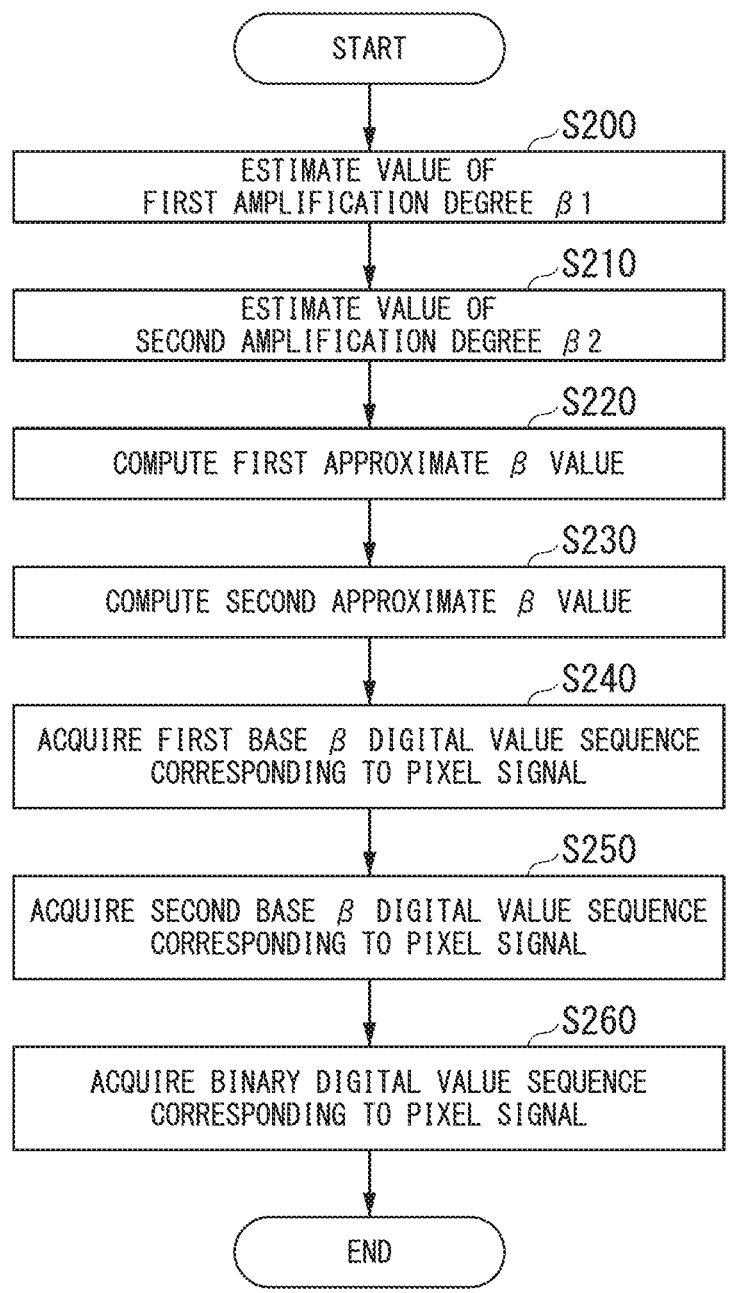
FIG. 7 is a flowchart showing a flow of processing according to AD conversion and binarization to be performed by the image capturing device according to the second embodiment of the present invention.
Figure 8:
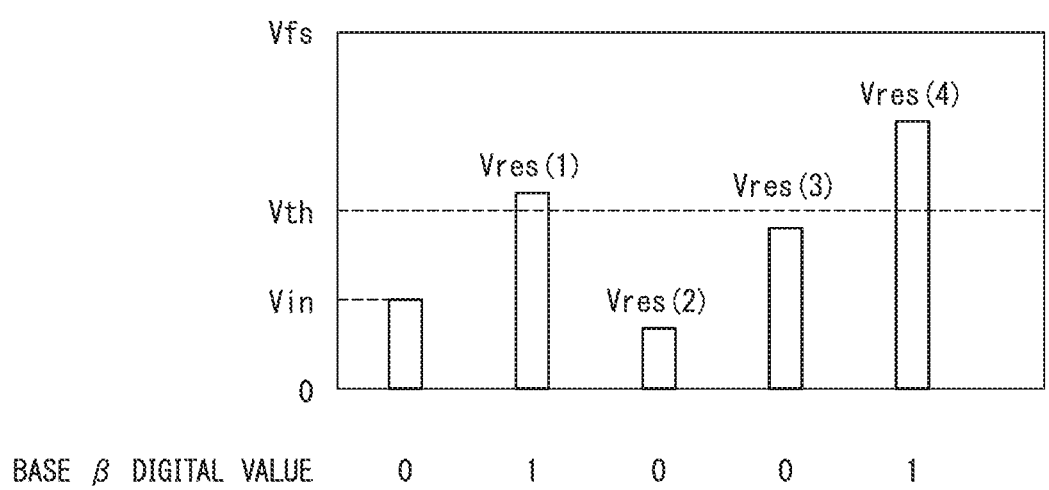
FIG. 8 is a reference diagram showing a state of AD conversion by a cyclic AD conversion circuit.

Next, a flow of processing according to AD conversion and binarization will be described. FIG. 7 shows the flow of the processing according to the AD conversion and the binarization.

<Step S200>

First, a value of a first amplification degree β1 is estimated. As in the first embodiment, the estimation of the first amplification degree β1 is performed by acquiring two series of first base β digital value sequences of a first base β digital value sequence having an MSB of "0" and a first base β digital value sequence having an MSB of "1" using a first β estimation signal and finding a value of the first amplification degree β1 in which a difference between the two series of acquired first base β digital value sequences is minimized.

Specifically, the following process is performed. The first calculator 100*a* acquires the two series of first base β digital value sequences corresponding to the same first β estimation signal. The first β estimation signal, for example, is a signal having a voltage value substantially equal to a magnitude of a first threshold value Vth1 of the comparison circuit COMP1*a*. While the estimation of the value of the first amplification degree β1 is performed, the switch SW1*a* outputs the first β estimation signal.

When the MSB is computed, the switch SW2*a* outputs the first β estimation signal output from the switch SW1*a* as a first analog signal. In addition, when a bit other than the MSB is computed, the switch SW2*a* outputs the first residual signal Vres1 output from the amplification circuit M1*a* as the first analog signal.

The comparison circuit COMP1*a* compares a magnitude of a first sampling signal Vs1 output from the S/H circuit SH1*a* with the first threshold value Vth1 to generate a first digital value Qout1 according to a comparison result. The switch SW3*a* outputs a first digital value Qmsb1 when the MSB is computed. The first digital value Qmsb1 is "0" when the first base β digital value sequence having the MSB of "0" is acquired. In addition, the first digital value Qmsb1 is "1" when the first base β digital value sequence having the MSB of "1" is acquired. The switch SW3*a* outputs the first digital value Qout1 when the bit other than the MSB is computed.

The amplification circuit M1*a* amplifies the first sampling signal Vs1 by multiplying the first sampling signal Vs1 output from the S/H circuit SH1*a* by the first amplification degree β1. Further, the amplification circuit M1*a* outputs the first residual signal Vres1 by executing computation according to the first digital value Qmsb1 output from the switch SW3*a* when the MSB is computed and executing computation according to the first digital value Qout1 output from the switch SW3*a* when the bit other than the MSB is computed.

After sequentially outputting digital values constituting one of the two series of first base β digital value sequences, the first comparator 101*a* sequentially outputs digital values constituting the other of the two series of first base β digital value sequences. The latch section 104 holds the two series of first base β digital value sequences and outputs the held first base β digital value sequences as a digital signal Dout. The MSB of the two series of first base β digital value sequences is the first digital value Qmsb1 and the bit other than the MSB of the two series of first base β digital value sequences is the first digital value Qout1.

The β estimation section 170 estimates a value of the first amplification degree β1 based on the two series of first base β digital value sequences output from the latch section 104. Because a method of estimating the value of the first amplification degree β1 is similar to the method of estimating the amplification degree β in the first embodiment, a description thereof will be omitted.

The β estimation section 170 performs the above-described process based on the two series of first base β digital value sequences computed by each of the six first calculators 100*a* to estimate values of first amplification degrees $\beta1_1$ to $\beta1_6$ corresponding to the six first calculators 100*a*.

<Step S210>

After a value of a first amplification degree β1 is estimated, a value of a second amplification degree β2 is estimated. As in the first embodiment, the estimation of the second amplification degree β2 is performed by acquiring two series of second base β digital value sequences of a second base β digital value sequence having an MSB of "0" and a second base β digital value sequence having an MSB of "1" using a second β estimation signal and finding the value of the second amplification degree β2 in which the difference between the two series of acquired second base β digital value sequences is minimized.

Specifically, the following process is performed. The second calculator 100*b* acquires the two series of second base β digital value sequences corresponding to the same second β estimation signal. The second β estimation signal, for example, is a signal having a voltage value substantially equal to a magnitude of a second threshold value Vth2 of the comparison circuit COMP1*b*. While the estimation of the value of the second amplification degree β2 is performed, the switch SW1*b* outputs the second β estimation signal.

When the MSB is computed, the switch SW2*b* outputs the second β estimation signal output from the switch SW1*b* as a third analog signal. In addition, when a bit other than the MSB is computed, the switch SW2*b* outputs the second residual signal Vres2 output from the amplification circuit M1*b* as the third analog signal.

The comparison circuit COMP1*b* compares a magnitude of a second sampling signal Vs2 output from the S/H circuit SH1*b* with the second threshold value Vth2 to generate a second digital value Qout2 according to a comparison result. The switch SW3*b* outputs a second digital value Qmsb2 when the MSB is computed. The second digital value Qmsb2 is "0" when the second base β digital value sequence having the MSB of "0" is acquired. In addition, the second digital value Qmsb2 is "1" when the second base β digital value sequence having the MSB of "1" is acquired. The switch SW3*b* outputs the second digital value Qout2 when the bit other than the MSB is computed.

The amplification circuit M1*b* amplifies the second sampling signal Vs2 by multiplying the second sampling signal Vs2 output from the S/H circuit SH1*b* by the second amplification degree β2. Further, the amplification circuit M1*b* outputs the second residual signal Vres2 by executing computation according to the second digital value Qmsb2 output from the switch SW3b when the MSB is computed and executing computation according to the second digital value Qout2 output from the switch SW3b when the bit other than the MSB is computed.

After sequentially outputting digital values constituting one of the two series of second base β digital value sequences, the second comparator 101b sequentially outputs digital values constituting the other of the two series of second base β digital value sequences. The latch section 104 holds the two series of second base β digital value sequences and outputs the held second base β digital value sequences as a digital signal Dout. The MSB of the two series of second base β digital value sequences is the second digital value Qmsb2 and the bit other than the MSB of the two series of second base β digital value sequences is the second digital value Qout2.

The β estimation section 170 estimates a value of the second amplification degree β2 based on the two series of second base β digital value sequences output from the latch section 104. Because a method of estimating the value of the second amplification degree β2 is similar to the method of estimating the amplification degree β in the first embodiment, a description thereof will be omitted.

The β estimation section 170 performs the above-described process based on the two series of second base β digital value sequences computed by each of the six second calculators 100b to estimate values of second amplification degrees $\beta2_1$ to $\beta2_6$ corresponding to the six second calculators 100b.

Although the process of step S210 is performed after the process of step S200 is performed in the above description, the process of step S200 may be performed after the process of step S210 is performed. In addition, the process in which the first calculator 100a acquires the first base β digital value sequence corresponding to the first β estimation signal and the process in which the second calculator 100b acquires the second base β digital value sequence corresponding to the second β estimation signal may be performed in parallel.

<Step S220>

After the values of the first amplification degrees β1 and the second amplification degrees β2 are estimated, a first approximate β value for approximating a plurality of first amplification degrees β1 is computed. Specifically, the following process is performed. The β estimation section 170 computes the first approximate β value based on the estimated values of the first amplification degrees $\beta1_1$ to $\beta1_6$ corresponding to the six first calculators 100a.

For example, the β estimation section 170 computes the first approximate β value β(1) by performing computation shown in the following Formula (2-1). In this example, the first approximate β value β(1) is the average value of the values of the plurality of estimated first amplification degrees β1.

$$\beta(1) = (\alpha 1_1 \alpha 1_2 \ldots \alpha 1_n \ldots \alpha 1_6) \begin{pmatrix} \beta 1_1 \\ \beta 1_2 \\ \ldots \\ \beta 1_n \\ \ldots \\ \beta 1_6 \end{pmatrix} = \sum_{n=1}^{6} \alpha 1_n \times \beta 1_n \quad (2\text{-}1)$$

where $$\sum_{n=1}^{6} \alpha 1_n = 1.$$

When the first approximate β value β(1) is computed as an average value which is not weighted, a coefficient ($\alpha 1_1$, $\alpha 1_2$, $\alpha 1_3$, $\alpha 1_4$, $\alpha 1_5$, $\alpha 1_6$) of Formula (2-1) is expressed by the following Formula (2-2).

$$(\alpha 1_1, \alpha 1_2, \alpha 1_3, \alpha 1_4, \alpha 1_5, \alpha 1_6) = (\frac{1}{6}, \frac{1}{6}, \frac{1}{6}, \frac{1}{6}, \frac{1}{6}, \frac{1}{6}) \quad (2\text{-}2)$$

The above is an example, but the present invention is not limited thereto. For example, the following Formula (2-3) may be used instead of Formula (2-2). In this case, only a value of the first amplification degree $\beta 1_3$ may be estimated.

$$(\alpha 1_1, \alpha 1_2, \alpha 1_3, \alpha 1_4, \alpha 1_5, \alpha 1_6) = (0, 0, 1, 0, 0, 0) \quad (2\text{-}3)$$

<Step S230>

After the first approximate value β1(1) is computed, a second approximate β value for approximating a plurality of second amplification degrees β2 is computed. Specifically, the following process is performed. The β estimation section 170 computes the second approximate β value based on the estimated values of the second amplification degrees $\beta2_1$ to $\beta2_6$ corresponding to the six second calculators 100b.

For example, the β estimation section 170 computes the second approximate β value β(2) by performing computation shown in the following Formula (2-4). In this example, the second approximate β value β(2) is the average value of the values of the plurality of estimated second amplification degrees β2.

$$\beta(2) = (\alpha 2_1 \alpha 2_2 \ldots \alpha 2_n \ldots \alpha 2_6) \begin{pmatrix} \beta 2_1 \\ \beta 2_2 \\ \ldots \\ \beta 2_n \\ \ldots \\ \beta 2_6 \end{pmatrix} = \sum_{n=1}^{6} \alpha 2_n \times \beta 2_n \quad (2\text{-}4)$$

where $$\sum_{n=1}^{6} \alpha 2_n = 1.$$

When the second approximate β value β(2) is computed as an average value which is not weighted, a coefficient ($\alpha 2_1$, $\alpha 2_2$, $\alpha 2_3$, $\alpha 2_4$, $\alpha 2_5$, $\alpha 2_6$) of Formula (2-4) is expressed by the following Formula (2-5).

$$(\alpha 2_1, \alpha 2_2, \alpha 2_3, \alpha 2_4, \alpha 2_5, \alpha 2_6) = (\frac{1}{6}, \frac{1}{6}, \frac{1}{6}, \frac{1}{6}, \frac{1}{6}, \frac{1}{6}) \quad (2\text{-}5)$$

The above is an example, but the present invention is not limited thereto. For example, the following Formula (2-6) may be used instead of Formula (2-5). In this case, only a value of the second amplification degree $\beta 2_3$ may be estimated.

$$(\alpha 2_1, \alpha 2_2, \alpha 2_3, \alpha 2_4, \alpha 2_5, \alpha 2_6) = (0, 0, 1, 0, 0, 0) \quad (2\text{-}6)$$

Although the process of step S230 is performed after the process of step S220 is performed in the above description, the process of step S220 may be performed after the process of step S230 is performed.

<Step S240>

After the first approximate β value and the second approximate β value are computed, the first base β digital value sequence corresponding to the pixel signal Pixel is acquired. Specifically, the following process is performed. While the first base β digital value sequence corresponding to the pixel signal Pixel is acquired, the switch SW1a outputs the pixel signal Pixel.

When the MSB is computed, the switch SW2a outputs the pixel signal Pixel output from the switch SW1a as a first analog signal. In addition, when a bit other than the MSB is computed, the switch SW2a outputs the residual signal Vres1 output from the amplification circuit M1a as the first analog signal.

The comparison circuit COMP1a compares a magnitude of a first sampling signal Vs1 output from the S/H circuit SH1a with the first threshold value Vth1 to generate a first digital value Qout1 according to a comparison result. The switch SW3a outputs the first digital value Qout1.

The amplification circuit M1a amplifies the first sampling signal Vs1 by multiplying the first sampling signal Vs1 output from the S/H circuit SH1a by the first amplification degree β1. Further, the amplification circuit M1a outputs the first residual signal Vres1 by executing computation according to the first digital value Qout1 output from the switch SW3a.

The first comparator 101a sequentially outputs the first digital value Qout1 constituting the first base β digital value sequence. The latch section 104 holds the first base β digital value sequence and outputs the held first base β digital value sequence as a digital signal Dout. The MSB of the first base β digital value sequence is the first digital value Qout1 according to the comparison result of the magnitude of the pixel signal Pixel and the first threshold value Vth1, and the bit other than the MSB of the first base β digital value sequence is the first digital value Qout1 according to the comparison result of the magnitude of the first residual signal Vres1 and the first threshold value Vth1.

<Step S250>

After the first base β digital value sequence is computed, a second base β digital value sequence corresponding to the pixel signal Pixel is acquired. Specifically, the following process is performed. While the second base β digital value sequence corresponding to the pixel signal Pixel is acquired, the switch SW1b outputs the first residual signal Vres1 output from the first calculator 100a. At this time, the first residual signal Vres1 is that computed when the first calculator 100a computes a least significant bit (LSB) among bits constituting the first base β digital value sequence.

When the MSB is computed, the switch SW2b outputs the first residual signal Vres1 output from the switch SW1b as a third analog signal. In addition, when a bit other than the MSB is computed, the switch SW2b outputs the second residual signal Vres2 output from the amplification circuit M1b as the third analog signal.

The comparison circuit COMP1b compares a magnitude of a second sampling signal Vs2 output from the S/H circuit SH1b with the second threshold value Vth2 to generate a second digital value Qout2 according to a comparison result. The switch SW3b outputs the second digital value Qout2.

The amplification circuit M1b amplifies the second sampling signal Vs2 by multiplying the second sampling signal Vs2 output from the S/H circuit SH1b by the second amplification degree β2. Further, the amplification circuit M1b outputs the second residual signal Vres2 by executing computation according to the second digital value Qout2 output from the switch SW3b.

The second comparator 101b sequentially outputs the second digital value Qout2 constituting the second base β digital value sequence. The latch section 104 holds the second base β digital value sequence and outputs the held second base β digital value sequence as a digital signal Dout. The MSB of the second base β digital value sequence is the second digital value Qout2 according to the comparison result of the magnitude of the first residual signal Vres1 and the second threshold value Vth2, and the bit other than the MSB of the second base β digital value sequence is the second digital value Qout2 according to the comparison result of the magnitude of the second residual signal Vres2 and the second threshold value Vth2.

<Step S260>

After the first and second base β digital value sequences corresponding to the pixel signal Pixel are acquired, a binary digital value sequence corresponding to the pixel signal Pixel is acquired. At this time, a process in which the first base β digital value sequence is considered to be a first approximate base β digital value sequence having a first approximate β value as a base and the second base β digital value sequence is considered to be a second approximate base β digital value sequence having a second approximate β value as a base is performed. Specifically, the following process is performed. The binarization section 171 acquires binary digital value sequences corresponding to combinations of two or more of the six first calculators 100a and two or more of the six second calculators 100b based on the first base β digital value sequence and the first approximate β value output from each of the two or more of the six first calculators 100a and the second base β digital value sequence and the second approximate β value output from each of the two or more of the six second calculators 100b.

Specifically, the binarization section 171 acquires a binary digital value sequence corresponding to a combination of the first calculator 100a and the second calculator 100b of the same column of the pixel array of the image capturing section 2 based on the first and second base β digital value sequences and the first and second approximate β values acquired by the first calculator 100a and the second calculator 100b of the same column of the pixel array of the image capturing section 2. The binarization section 171 performs the above-described process for every column of the pixel array of the image capturing section 2 and acquires a binary digital value sequence.

Through the above-described process, the binary digital value sequence corresponding to the pixel signals output from the section pixels 3 of one row of the pixel array of the image capturing section 2 is acquired. In parallel with an operation in which the second calculator 100b computes the second base β digital value sequence constituting a digital value of lower bits corresponding to the pixel signals Pixel output from the section pixels 3 of a first row of the pixel array of the image capturing section 2, the first calculator 100a can compute the first base β digital value sequence constituting a digital value of upper bits corresponding to the pixel signals Pixel output from the section pixels 3 of a second row of the pixel array of the image capturing section 2. Thus, it is possible to shorten the time required for cyclic AD conversion and increase the speed of the image capturing device as compared with the first embodiment. It is possible to acquire binary digital value sequences corresponding to pixel signals output from all the section pixels 3 of the image capturing section 2 by performing the process of steps S240 to S260 following an operation in which the pixel signals are sequentially read for every row.

According to this embodiment, an image capturing device 1b includes an image capturing section 2 having a plurality of pixels (section pixels 3) disposed in a matrix and configured to output a pixel signal Pixel via a first signal line (vertical signal line 13) connected to pixels (section pixels 3) arranged in a first direction (vertical direction) among the plurality of pixels (section pixels 3); a plurality of first calculators 100a, which are first calculators 100a configured to perform cyclic AD conversion, each including: a first comparator 101a configured to compare a magnitude of a first analog signal (first sampling signal Vs1) with a first threshold value Vth1 to generate a first digital value Qout1 according to a comparison result; a first amplification section 102a configured to amplify the first analog signal (first sampling signal Vs1) by multiplying the first analog signal (first sampling signal Vs1) by a first amplification degree β1 (1<β1<2) and output a second analog signal (first residual signal Vres1) by executing computation according to the first digital value Qout1; and a first switching section 103a configured to output one of the pixel signal Pixel and a first β estimation signal for estimating a value of the amplification degree β1 as the first analog signal when an MSB of the first digital value sequence (first base β digital value sequence) including a plurality of first digital values Qout1 is computed, and output the second analog signal (first residual signal Vres1) as the first analog signal when a bit other than the MSB of the first digital value sequence (first base β digital value sequence) is computed, the plurality of first calculators 100a outputting the first digital value sequence (first base β digital value sequence) and the second analog signal (first residual signal Vres1); a plurality of second calculators 100b, which are second calculators 100b configured to perform cyclic AD conversion, each including: a second comparator 101b configured to compare a magnitude of a third analog signal (second sampling signal Vs2) with a second threshold value Vth2 to generate a second digital value Qout2 according to a comparison result; a second amplification section 102b configured to amplify the third analog signal (second sampling signal Vs2) by multiplying the third analog signal (second sampling signal Vs2) by a second amplification degree β2 (1<β<2) and output a fourth analog signal (second residual signal Vres2) by executing computation according to the second digital value Qout2; and a second switching section 103b configured to output one of the second analog signal (first residual signal Vres1) and a second β estimation signal for estimating a value of the amplification degree β2 as the third analog signal when an MSB of the second digital value sequence (second base β digital value sequence) including a plurality of second digital values Qout2 is computed, and output the fourth analog signal (second residual signal Vres1) as the third analog signal when a bit other than the MSB of the second digital value sequence (second base β digital value sequence) is computed, the plurality of second calculators 100b outputting the second digital value sequence (second base β digital value sequence); a latch section 104 configured to latch the first digital value sequence (first base β digital value sequence) and the second digital value sequence (second base β digital value sequence); a β estimation signal output section 18 configured to output the first β estimation signal and the second β estimation signal; a β estimation section 170 configured to estimate a value of the first amplification degree β1 based on the first digital value sequence (first base β digital value sequence) when the first β estimation signal is output as the first analog signal and estimate a value of the second amplification degree β1 based on the second digital value sequence (second base β digital value sequence) when the second β estimation signal is output as the third analog signal; and a binarization section 171 configured to acquire a third digital value sequence (binary digital value sequence) which is a binary number, based on the first digital value sequence (first base β digital value sequence), the estimated value of the first amplification degree β1, the second digital value sequence (second base β digital value sequence), and the estimated value of the second amplification degree β2; wherein the plurality of first calculators 100a are disposed one by one in correspondence with one or more columns of an array of the plurality of pixels (section pixels 3); wherein the plurality of second calculators 100b are disposed one by one in correspondence with one or more columns of an array of the plurality of pixels (section pixels 3); wherein the β estimation signal output section 18 is disposed in correspondence with two or more of the plurality of second calculators 100b; wherein the β estimation section 170 is disposed in correspondence with two or more of the plurality of second calculators 100b; and wherein the binarization section 171 is disposed in correspondence with two or more of the plurality of second calculators 100b.

Because the β estimation signal output section 18, the β estimation section 170, and the binarization section 171 are disposed in correspondence with two or more of the plurality of second calculators 100b, circuits of the β estimation signal output section 18, the β estimation section 170, and the binarization section 171 are disposed in correspondence with a plurality of columns of an array of the plurality of pixels (section pixels 3). For example, for the circuits, a region for the plurality of columns of the array of the plurality of pixels (section pixels 3) may be allocated. Thus, even when the circuit scale of an element constituting the cyclic AD conversion circuit is large, it is possible to configure an image capturing device in which the cyclic AD conversion circuit is disposed. Further, in parallel with an operation in which the second calculator 100b computes the second base β digital value sequence constituting a digital value of lower bits corresponding to the first pixel signal, the first calculator 100a computes the first base β digital value sequence constituting a digital value of upper bits corresponding to the second pixel signal. Thus, it is possible to shorten the time required for cyclic AD conversion and increase a speed of the image capturing device as compared with the first embodiment.

In addition, according to this embodiment, in the image capturing device 1b, when the third digital value sequence (binary digital value sequence) corresponding to the pixel signal is acquired, the β estimation section 170 estimates the value of the first amplification degree β1 corresponding to a predetermined first calculator 100a of the plurality of first calculators 100a based on two series of first digital value sequences (first base β digital value sequences) corresponding to the same first β estimation signal to compute a first approximate β value based on the estimated value of the first amplification degree β1 and estimates the value of the second amplification degree β2 corresponding to a predetermined second calculator 100b of the plurality of second calculators 100b based on two series of second digital value sequences (second base β digital value sequences) corresponding to the same second β estimation signal to compute a second approximate β value based on the estimated value of the second amplification degree β2, and the binarization section 171 acquires third digital value sequences (binary digital value sequences) corresponding to combinations of the two or more of the plurality of first calculators 100a and the two or more of the plurality of second calculators 100b based on the first digital value sequence (first base β digital value sequence) and the first approximate β value output from each of the two or more of the plurality of first calculators 100a and the second digital value sequence (second base β digital value sequence) and the second approximate β value output from each of the two or more of the plurality of second calculators 100b.

When the first digital value sequence (first base β digital value sequence) acquired by each of the plurality of first calculators 100a and the second digital value sequence (second base β digital value sequence) acquired by each of the plurality of second calculators 100b are converted into the third digital value sequence (binary digital value sequence), the circuit scale becomes huge in the image capturing device configured to perform the conversion using a value of the first amplification degree $\beta 1$ corresponding to each of the plurality of first calculators 100*a* and a value of the second amplification degree $\beta 2$ corresponding to each of the plurality of second calculators 100*b*. As in this embodiment, it is possible to reduce the circuit scale in the image capturing device configured to perform the conversion using the first approximate $\beta$ value (average value or the like) for the value of the first amplification degree $\beta 1$ corresponding to each of the plurality of first calculators 100*a* and the second approximate $\beta$ value (average value or the like) for the value of the second amplification degree $\beta 2$ corresponding to each of the plurality of second calculators 100*b*.

Third Embodiment

Next, the third embodiment of the present invention will be described. The configuration of the image capturing device according to this embodiment is substantially similar to the configuration of the image capturing device 1*b* according to the second embodiment.

A column processing section 15 of this embodiment is divided into a first circuit block and a second circuit block as in the first embodiment. The first circuit block is constituted of column AD converters 16*b* disposed in odd columns. The second circuit block is constituted of column AD converters 16*b* disposed in even columns.

Hereinafter, a difference from a flow of the processing shown in FIG. 7 between the flows of the processing related to AD conversion and binarization will be described. As in the process of step S200, a value of a first amplification degree $\beta 1$ is estimated. Subsequently, as in the process of step S210, a value of a second amplification degree $\beta 2$ is estimated.

After the value of the first amplification degree $\beta 1$ and the value of the second amplification degree $\beta 2$ are estimated, a first approximate $\beta$ value and a second approximate $\beta$ value are computed. Specifically, the following process is performed. The $\beta$ estimation section 170 computes the first approximate $\beta$ value based on the estimated values of first amplification degrees $\beta 1_1$ to $\beta 1_6$ corresponding to the six first calculators 100*a*. In addition, the $\beta$ estimation section 170 computes the second approximate $\beta$ value based on the estimated values of second amplification degrees $\beta 2_1$ to $\beta 2_6$ corresponding to the six second calculators 100*b*.

In this embodiment, the six first calculators 100*a* and the six second calculators 100*b* are divided into a plurality of groups (first and second circuit blocks), each of which includes two or more first calculators 100*a* and two or more second calculators 100*b*. The $\beta$ estimation section 170 computes the first approximate $\beta$ value corresponding to a group based on the estimated value of the first amplification degree $\beta 1$ corresponding to each of the two or more first calculators 100*a* within the group. That is, the $\beta$ estimation section 170 computes the first approximate $\beta$ value for every group. In addition, the $\beta$ estimation section 170 computes the second approximate $\beta$ value corresponding to a group based on the estimated value of the second amplification degree $\beta 2$ corresponding to each of the two or more second calculators 100*b* within the group. That is, the $\beta$ estimation section 170 computes the second approximate $\beta$ value for every group.

Specifically, the $\beta$ estimation section 170 computes a first approximate $\beta$ value $\beta 1(1)$ corresponding to the first circuit block based on values of the amplification degrees $\beta 1_1$, $\beta 1_3$, and $\beta 1_5$ corresponding to three first calculators 100*a* included in the first circuit block and computes a first approximate $\beta$ value $\beta 1(2)$ corresponding to the second circuit block based on values of the amplification degrees $\beta 1_2$, $\beta 1_4$, and $\beta 1_6$ corresponding to three first calculators 100*a* included in the second circuit block.

In addition, the $\beta$ estimation section 170 computes a second approximate $\beta$ value $\beta 2(1)$ corresponding to the first circuit block based on values of the amplification degrees $\beta 2_1$, $\beta 2_3$, and $\beta 2_5$ corresponding to three second calculators 100*b* included in the first circuit block and computes a second approximate $\beta$ value $\beta 2(2)$ corresponding to the second circuit block based on values of the amplification degrees $\beta 2_2$, $\beta 2_4$, and $\beta 2_6$ corresponding to three second calculators 100*b* included in the second circuit block.

After the first and second approximate $\beta$ values corresponding to each of the first and second circuit blocks are computed, a first base $\beta$ digital value sequence is acquired as in the process of step S240. Subsequently, a second base $\beta$ digital value sequence is acquired as in the process of step S250.

Subsequently, as in the process of step S260, a binary digital value sequence is acquired. When binary digital value sequences corresponding to the first and second base $\beta$ digital value sequences acquired in the first circuit block are acquired, a process in which the first base $\beta$ digital value sequence is considered to be a first approximate base $\beta$ digital value sequence having a first approximate $\beta$ value $\beta 1(1)$ as a base and the second base $\beta$ digital value sequence is considered to be a second approximate base $\beta$ digital value sequence having a second approximate $\beta$ value $\beta 2(1)$ as a base is performed. In addition, when binary digital value sequences corresponding to the first and second base $\beta$ digital value sequences acquired in the second circuit block are acquired, a process in which the first base $\beta$ digital value sequence is considered to be a first approximate base $\beta$ digital value sequence having a first approximate $\beta$ value $\beta 1(2)$ as a base and the second base $\beta$ digital value sequence is considered to be a second approximate base $\beta$ digital value sequence having a second approximate $\beta$ value $\beta 2(2)$ as a base is performed.

Specifically, the following process is performed. The binarization section 171 acquires a binary digital value sequence corresponding to a combination of each of the first calculators 100*a* included in the first circuit block and each of the second calculators 100*b* included in the first circuit block based on the first base $\beta$ digital value sequence and the first approximate $\beta$ value $\beta 1(1)$ output from each of the first calculators 100*a* included in the first circuit block and the second base $\beta$ digital value sequence and the second approximate $\beta$ value $\beta 2(1)$ output from each of the second calculators 100*b* included in the first circuit block. In addition, the binarization section 171 acquires a binary digital value sequence corresponding to a combination of each of the first calculators 100*a* included in the second circuit block and each of the second calculators 100*b* included in the second circuit block based on the first base $\beta$ digital value sequence and the first approximate $\beta$ value $\beta 1(2)$ output from each of the first calculators 100*a* included in the second circuit block and the second base $\beta$ digital value sequence and the second approximate $\beta$ value $\beta 2(2)$ output from each of the second calculators 100*b* included in the second circuit block.

Specifically, the binarization section 171 acquires a binary digital value sequence corresponding to a combination of the first calculator 100*a* and the second calculator 100*b* of the same odd column of the pixel array of the image capturing section 2 based on the first base β digital value sequence, the second base β digital value sequence, the first approximate β value β1(1), and the second approximate β value β2(1) acquired by the first calculator 100a and the second calculator 100b of the same odd column of the pixel array of the image capturing section 2. In addition, the binarization section 171 acquires a binary digital value sequence corresponding to a combination of the first calculator 100a and the second calculator 100b of the same even column of the pixel array of the image capturing section 2 based on the first base β digital value sequence, the second base β digital value sequence, the first approximate β value β1(2), and the second approximate β value β2(2) acquired by the first calculator 100a and the second calculator 100b of the same even column of the pixel array of the image capturing section 2. The binarization section 171 performs the above-described process for every column of the pixel array of the image capturing section 2 and acquires the binary digital value sequence.

Through the above-described process, the binary digital value sequence corresponding to the pixel signals output from the section pixels 3 of one row of the pixel array of the image capturing section 2 is acquired. In parallel with an operation in which the second calculator 100b computes the second base β digital value sequence constituting a digital value of lower bits corresponding to the pixel signals Pixel output from the section pixels 3 of a first row of the pixel array of the image capturing section 2, the first calculator 100a can compute the first base β digital value sequence constituting a digital value of upper bits corresponding to the pixel signals Pixel output from the section pixels 3 of a second row of the pixel array of the image capturing section 2. Thus, it is possible to shorten the time required for cyclic AD conversion and increase a speed of the image capturing device as compared with the first embodiment. It is possible to acquire binary digital value sequences corresponding to pixel signals output from all the section pixels 3 of the image capturing section 2 by performing the process of steps S240 to S260 following an operation in which the pixel signals are sequentially read for every row.

According to this embodiment, the image capturing device in which the plurality of first calculators 100a and the plurality of second calculators 100b are divided into a plurality of groups so that each group includes a predetermined number of first calculators 100a and a predetermined number of second calculators 100b, the β estimation section 170 computes the first approximate β value corresponding to the group based on the estimated value of the first amplification degree β1 corresponding to each of predetermined first calculators 100a within the group, and the β estimation section 170 computes the second approximate β value corresponding to the group based on the estimated value of the second amplification degree β2 corresponding to each of predetermined second calculators 100b within the group is configured.

In general, a color filter is disposed on a surface of a pixel constituting the image capturing device. According to an arrangement of a color filter, for example, a signal of a pixel having a color filter of the same color is configured to be output to a group of the same first calculator 100a and the same second calculator 100b, so that it is possible to compute an approximate β value suitable for each pixel.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An image capturing device comprising:
an image capturing section having a plurality of pixels disposed in a matrix and configured to output a pixel signal via a first signal line connected to pixels arranged in a first direction among the plurality of pixels;
a plurality of calculators, each of which is configured to perform cyclic analog-to-digital (AD) conversion and includes:
  a comparator configured to compare a magnitude of a first analog signal with a threshold value to generate a digital value according to a comparison result;
  an amplification section configured to amplify the first analog signal by multiplying the first analog signal by an amplification degree β ($1<β<2$) and output a second analog signal by executing computation according to the digital value; and
  a switching section configured to output one of the pixel signal and a β estimation signal for estimating a value of the amplification degree β as the first analog signal when a most significant bit (MSB) of a first digital value sequence including a plurality of digital values is computed, and output the second analog signal as the first analog signal when a bit other than the MSB of the first digital value sequence is computed, the plurality of calculators outputting the first digital value sequence;
a latch section configured to latch the first digital value sequence;
a β estimation signal output section configured to output the β estimation signal;
a β estimation section configured to estimate a value of the amplification degree β based on the first digital value sequence when the β estimation signal is output as the first analog signal; and
a binarization section configured to acquire a second digital value sequence which is a binary number, based on the first digital value sequence and the estimated value of the amplification degree β,
wherein the plurality of calculators are disposed one by one in correspondence with one or more columns of an array of the plurality of pixels;
the β estimation signal output section is disposed in correspondence with two or more of the plurality of calculators;
the β estimation section is disposed in correspondence with two or more of the plurality of calculators; and
the binarization section is disposed in correspondence with two or more of the plurality of calculators.

2. An image capturing device comprising:
an image capturing section having a plurality of pixels disposed in a matrix and configured to output a pixel signal via a first signal line connected to pixels arranged in a first direction among the plurality of pixels;
a plurality of first calculators, each of which is configured to perform cyclic AD conversion and includes:
  a first comparator configured to compare a magnitude of a first analog signal with a first threshold value to generate a first digital value according to a comparison result;

a first amplification section configured to amplify the first analog signal by multiplying the first analog signal by a first amplification degree β1 (1<β1<2) and output a second analog signal by executing computation according to the first digital value; and a first switching section configured to output one of the pixel signal and a first β estimation signal for estimating a value of the first amplification degree β1 as the first analog signal when an MSB of a first digital value sequence including a plurality of first digital values is computed, and output the second analog signal as the first analog signal when a bit other than the MSB of the first digital value sequence is computed, the plurality of first calculators outputting the first digital value sequence and the second analog signal;

a plurality of second calculators, each of which is configured to perform cyclic AD conversion and includes:

a second comparator configured to compare a magnitude of a third analog signal with a second threshold value to generate a second digital value according to a comparison result;

a second amplification section configured to amplify the third analog signal by multiplying the third analog signal by a second amplification degree β2 (1<β2<2) and output a fourth analog signal by executing computation according to the second digital value; and a second switching section configured to output one of the second analog signal and a second β estimation signal for estimating a value of the second amplification degree β2 as the third analog signal when an MSB of a second digital value sequence including a plurality of second digital values is computed, and output the fourth analog signal as the third analog signal when a bit other than the MSB of the second digital value sequence is computed, the plurality of second calculators outputting the second digital value sequence;

a latch section configured to latch the first digital value sequence and the second digital value sequence;

a β estimation signal output section configured to output the first β estimation signal and the second β estimation signal;

a β estimation section configured to estimate a value of the first amplification degree β1 based on the first digital value sequence when the first β estimation signal is output as the first analog signal and estimate a value of the second amplification degree β2 based on the second digital value sequence when the second β estimation signal is output as the third analog signal; and a binarization section configured to acquire a third digital value sequence which is a binary number based on the first digital value sequence, the estimated value of the first amplification degree β1, the second digital value sequence, and the estimated value of the second amplification degree β2, wherein the plurality of first calculators are disposed one by one in correspondence with one or more columns of an array of the plurality of pixels;

the plurality of second calculators are disposed one by one in correspondence with one or more columns of an array of the plurality of pixels;

the β estimation signal output section is disposed in correspondence with two or more of the plurality of second calculators;

the β estimation section is disposed in correspondence with two or more of the plurality of second calculators; and the binarization section is disposed in correspondence with two or more of the plurality of second calculators.

3. The image capturing device according to claim 1, wherein, when the second digital value sequence corresponding to the pixel signal is acquired, the β estimation section estimates the value of the amplification degree β corresponding to a predetermined calculator among the plurality of calculators based on two series of first digital value sequences corresponding to the same β estimation signal to compute an approximate β value based on the estimated value of the amplification degree β, and the binarization section acquires the second digital value sequence corresponding to each of the two or more of the plurality of calculators based on the first digital value sequence output from each of the two or more of the plurality of calculators and the approximate β value.

4. The image capturing device according to claim 3, wherein the plurality of calculators are divided into a plurality of groups so that each group includes a predetermined number of calculators; and the β estimation section computes the approximate β value corresponding to the group based on the estimated value of the amplification degree β corresponding to a predetermined calculator within the group.

5. The image capturing device according to claim 2, wherein, when the third digital value sequence corresponding to the pixel signal is acquired, the β estimation section estimates the value of the first amplification degree β1 corresponding to a predetermined first calculator among the plurality of first calculators based on two series of first digital value sequences corresponding to the same first β estimation signal to compute a first approximate β value based on the estimated value of the first amplification degree β1 and estimates the value of the second amplification degree β2 corresponding to a predetermined second calculator among the plurality of second calculators based on two series of second digital value sequences corresponding to the same second β estimation signal to compute a second approximate β value based on the estimated value of the second amplification degree β2, and the binarization section acquires the third digital value sequence corresponding to a combination of each of the two or more of the plurality of first calculators and each of the two or more of the plurality of second calculators based on the first digital value sequence output from each of the two or more of the plurality of first calculators and the first approximate β value and the second digital value sequence output from each of the two or more of the plurality of second calculators and the second approximate β value.

6. The image capturing device according to claim 5, wherein the plurality of first calculators and the plurality of second calculators are divided into a plurality of groups so that each group includes a predetermined number of first calculators and a predetermined number of second calculators;

the β estimation section computes the first approximate β value corresponding to the group based on the estimated value of the first amplification degree β1 corresponding to a predetermined first calculator within the group; and the β estimation section computes the second approximate β value corresponding to the group based on the estimated value of the second amplification degree β2 corresponding to a predetermined second calculator within the group.

\* \* \* \* \*